(12) United States Patent
Eckel et al.

(10) Patent No.: US 11,291,103 B2
(45) Date of Patent: Mar. 29, 2022

(54) UNIAXIAL COUNTER-PROPAGATING MONOLASER ATOM TRAP

(71) Applicant: Government of the United States of America, as represented by the Secretary of Commerce, Gaithersburg, MD (US)

(72) Inventors: Stephen Paul Eckel, Rockville, MD (US); Daniel Schaeder Barker, Berwyn Heights, MD (US); James Anthony Fedchak, Washington, DC (US); Julia Kay Scherschligt, Montgomery Village, MD (US); Eric Burton Norrgard, Silver Spring, MD (US); Nikolai Nikolaevich Klimov, Ellicott City, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 103 days.

(21) Appl. No.: 16/598,144

(22) Filed: Oct. 10, 2019

(65) Prior Publication Data
US 2020/0120785 A1    Apr. 16, 2020

Related U.S. Application Data

(60) Provisional application No. 62/744,385, filed on Oct. 11, 2018.

(51) Int. Cl.
| | |
|---|---|
| *H05H 3/02* | (2006.01) |
| *H01J 37/075* | (2006.01) |
| *H01J 37/08* | (2006.01) |
| *G02B 27/42* | (2006.01) |

(52) U.S. Cl.
CPC ............. *H05H 3/02* (2013.01); *H01J 37/075* (2013.01); *H01J 37/08* (2013.01); *G02B 27/42* (2013.01); *H01J 2237/0815* (2013.01)

(58) Field of Classification Search
None
See application file for complete search history.

(56) References Cited

U.S. PATENT DOCUMENTS

| | | |
|---|---|---|
| 8,710,428 B1 | 4/2014 | Loftus et al. |
| 8,803,072 B2 | 8/2014 | Booth et al. |

(Continued)

OTHER PUBLICATIONS

Nshii, C.C., et al., "A surfaced-patterned chip as a strong source of ultracold atoms for quantum technologies", Nature Nanotechnology, 2013, p. 321-324, vol. 8.

(Continued)

*Primary Examiner* — James Choi
(74) *Attorney, Agent, or Firm* — Office of Chief Counsel for National Institute of Standards and Technology

(57) ABSTRACT

A uniaxial counter-propagating monolaser atom trap cools and traps atoms with a single a laser beam and includes: an atom slower that slows atoms to form slowed atoms; an optical diffractor including: a first diffraction grating that receives primary light and produces first reflected light; a second diffraction grating that receives primary light and produces second reflected light; and a third diffraction grating that receives the primary light and produces third reflected light; and a trapping region that forms trap light from the reflected lights and receives slowed atoms to produce trapped atoms from the slowed atoms that interact with the trap light.

18 Claims, 15 Drawing Sheets

(56) References Cited

U.S. PATENT DOCUMENTS

| | | | |
|---|---|---|---|
| 10,278,275 B2 | 4/2019 | Imhof | |
| 2015/0200029 A1* | 7/2015 | Hughes | G21K 1/006 250/251 |
| 2017/0359888 A1* | 12/2017 | Imhof | G21K 1/006 |
| 2019/0200445 A1 | 6/2019 | Imhof | |

OTHER PUBLICATIONS

McGilligan, J.P., et al., "Phase-space properties of magneto-optical traps utilising micro-fabricated gratings", Optics Express, 2015, p. 8948-8959, vol. 23 No.7.

Cotter, J.P., et al., "Design and fabrication of diffractive atom chips for laser cooling and trapping", Applied Physics B, 2016, 172 p. 1-6, vol. 122.

Imhof, E., et al., "Two-dimensional grating magneto-optical trap", Physical Review A, 2017, p. 033636, vol. 96.

Lee, J., et al., "Sub-doppler cooling of neutral atoms in a grating magneto-optical trap", Journal of Optical Society of America, 2013, p. 2869-2874, vol. 30 No. 11.

Gustavson, T.L., et al., "Rotation sensing with a dual atom-interferometer Sagnac gyroscope", Classical and Quantum Gravity, 2000, p. 2385-2398, vol. 17.

Kasevich, M., et al., "Atomic Interferometry Using Stimulated Raman Transitions", Physical Review Letters, 1991, p. 181-184, vol. 67 No.2.

\* cited by examiner

Side view            Top view

UNIAXIAL COUNTER-PROPAGATING MONOLASER ATOM TRAP

CROSS REFERENCE TO RELATED APPLICATIONS

The application claims priority to U.S. Provisional Patent Application Ser. No. 62/744,385 filed Oct. 11, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-050US1.

BRIEF DESCRIPTION

Disclosed is a uniaxial counter-propagating monolaser atom trap for cooling and trapping atoms with a single a laser beam, the uniaxial counter-propagating monolaser atom trap comprising: an atom source that provides primary atoms, such that the primary atoms move in an atom primary direction; a light source opposing the atom source and that produces primary light, the primary light propagating in a light primary direction, the light primary direction opposing the atom primary direction such that the primary light counter-propagates relative to the primary atoms; an atom slower interposed between the atom source and the light source and that: receives the primary atoms from the atom source; receives the primary light as slowing light; subjects the primary atoms to the slowing light; and slows the primary atoms to form slowed atoms from the primary atoms in response to interaction of the primary atoms with the slowing light, the slowed atoms moving in the atom primary direction; an optical diffractor interposed between the atom slower and the light source and comprising: a diffraction surface opposing the light source; a slower surface opposing the atom source; an atom transfer wall that bounds an atom transfer aperture; the atom transfer aperture that communicates the slowed atoms to a trapping region from the atom slower and communicates the primary light to the atom slower from the trapping region; a plurality of diffraction gratings disposed on the diffraction surface and comprising: a first diffraction grating that receives the primary light from the light source and produces first reflected light from the primary light, the first reflected light moving in a first light reflection direction; a second diffraction grating that receives the primary light from the light source and produces second reflected light from the primary light, the second reflected light moving in a second light reflection direction; and a third diffraction grating that receives the primary light from the light source and produces third reflected light from the primary light, the third reflected light moving in a third light reflection direction; the trapping region interposed between the optical diffractor and the light source and that: receives the first reflected light, the second reflected light, and the third reflected light such that the first reflected light, the second reflected light, and the third reflected light intersect in a reflected light intersection volume in the trapping region to form trap light from the first reflected light, the second reflected light, and the third reflected light; receives the slowed atoms in the trap light; and produces trapped atoms from the slowed atoms in response to subjecting the slowed atoms to the trap light.

Disclosed is an optical diffractor for cooling and trapping atoms with a single a laser beam, the optical diffractor comprising: a diffraction surface; a slower surface on a side of the optical diffractor opposite the diffraction surface; an atom transfer wall that bounds an atom transfer aperture; the atom transfer aperture that communicates slowed atoms to a trapping region from an atom slower and communicates primary light to the atom slower from the trapping region; a plurality of diffraction gratings disposed on the diffraction surface and comprising: a first diffraction grating that receives the primary light from a light source and produces first reflected light from the primary light, the first reflected light moving in a first light reflection direction; a second diffraction grating that receives the primary light from the light source and produces second reflected light from the primary light, the second reflected light moving in a second light reflection direction; and a third diffraction grating that receives the primary light from the light source and produces third reflected light from the primary light, the third reflected light moving in a third light reflection direction, wherein the diffraction gratings reflects the primary light as the first reflected light, the second reflected light, and the third reflected light respectively along the first light reflection direction, the second light reflection direction, and the third light reflection direction into the trapping region so that the first reflected light, the second reflected light, and the third reflected light intersect in a reflected light intersection volume in the trapping region and form trap light that traps the slowed atoms to form trapped atoms from the slowed atoms.

Disclosed is a process for cooling and trapping atoms with the uniaxial counter-propagating monolaser atom trap, the process comprising: providing primary atoms from the atom source, such that the primary atoms move in the atom primary direction; producing, by the light source, primary light, the primary light propagating in the light primary direction, the light primary direction opposing the atom primary direction; counter-propagating the primary light relative to the primary atoms; receiving, by the atom slower, the primary atoms from the atom source; communicating the primary light to the atom slower from the trapping region; receiving, by the atom slower, the primary light as slowing light; subjecting the primary atoms to the slowing light; slowing the primary atoms by the slowing light; forming the slowed atoms from the primary atoms in response to interaction of the primary atoms with the slowing light, the slowed atoms moving in the atom primary direction; communicating, by the atom transfer aperture, the slowed atoms to the trapping region from the atom slower receiving, by the first diffraction grating, the primary light from the light source; producing, by the first diffraction grating, the first reflected light from the primary light, the first reflected light moving in a first light reflection direction; receiving, by the second diffraction grating, the primary light from the light source; producing, by the second diffraction grating, the second reflected light from the primary light, the second reflected light moving in a second light reflection direction; receiving, by the third diffraction grating, the primary light from the light source; producing, by the third diffraction grating, the third reflected light from the primary light, the third reflected light moving in a third light reflection direction; receiving, by the trapping region, the first reflected light, the second reflected light, and the third reflected light; intersecting the first reflected light, the second reflected light, and the third reflected light in a reflected light intersection volume in the trapping region; forming trap light from the first reflected light, the second reflected light, and the third reflected light; receiving the slowed atoms in the trap light; and subjecting the slowed atoms to the trap light to produce trapped atoms from the slowed atoms.

BRIEF DESCRIPTION OF THE DRAWINGS

The following description should not be considered limiting in any way. With reference to the accompanying drawings, like elements are numbered alike.

DETAILED DESCRIPTION

Figure 1:
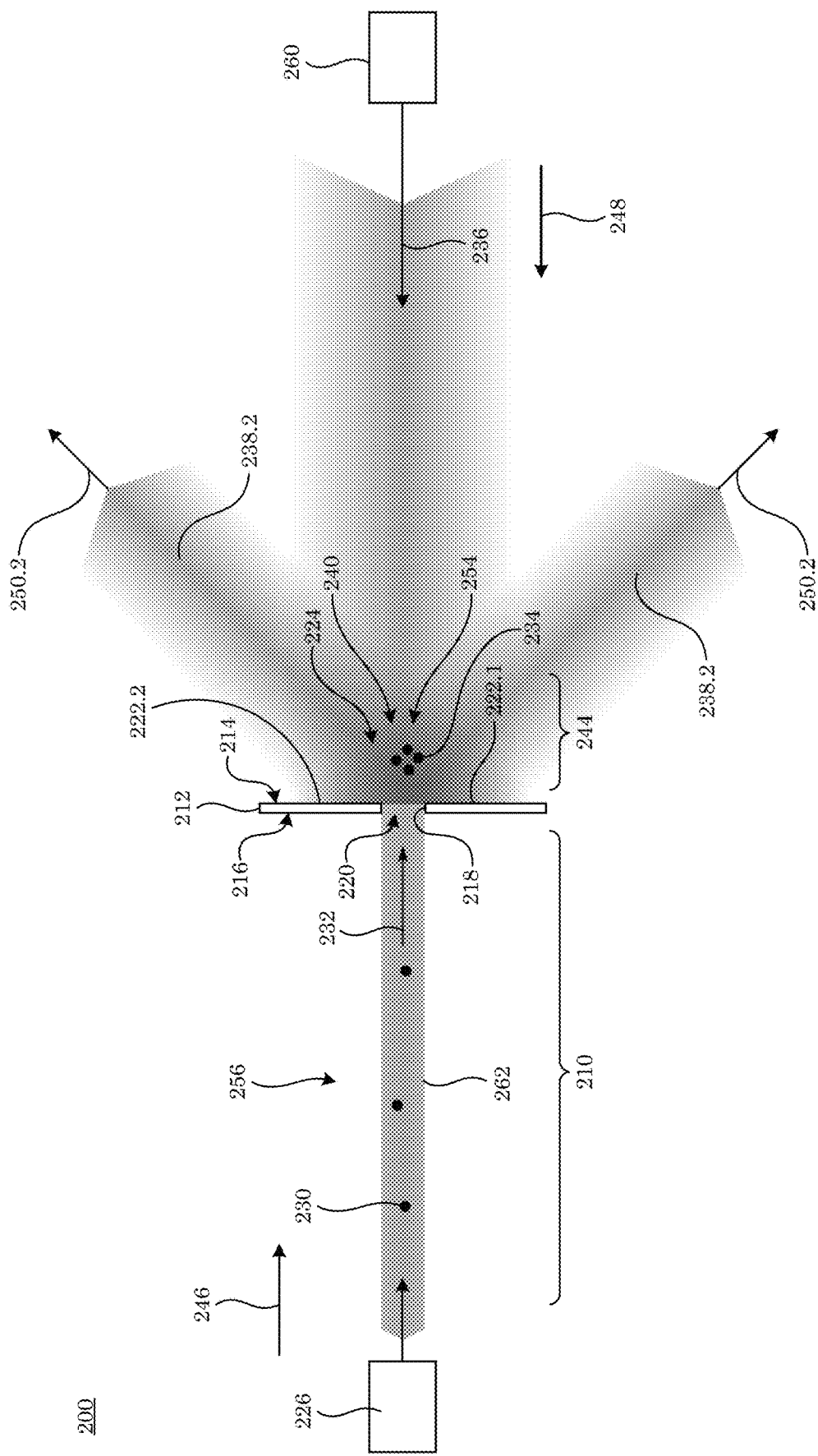
FIG. 1 shows a uniaxial counter-propagating monolaser atom trap.
Figure 2:
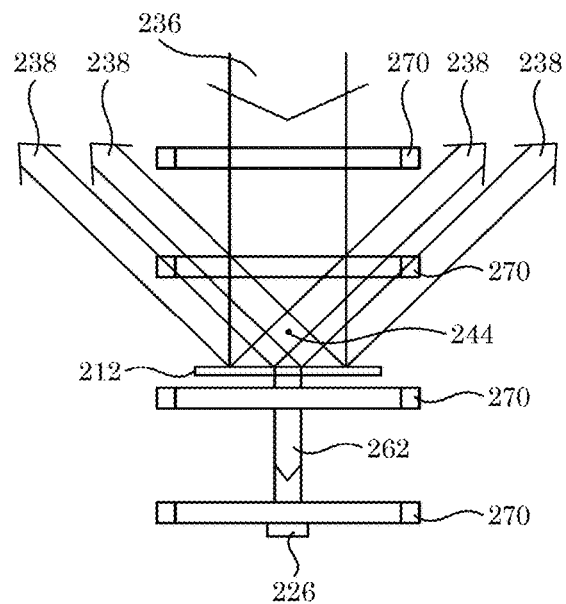
FIG. 2 shows a uniaxial counter-propagating monolaser atom trap.
Figure 2:
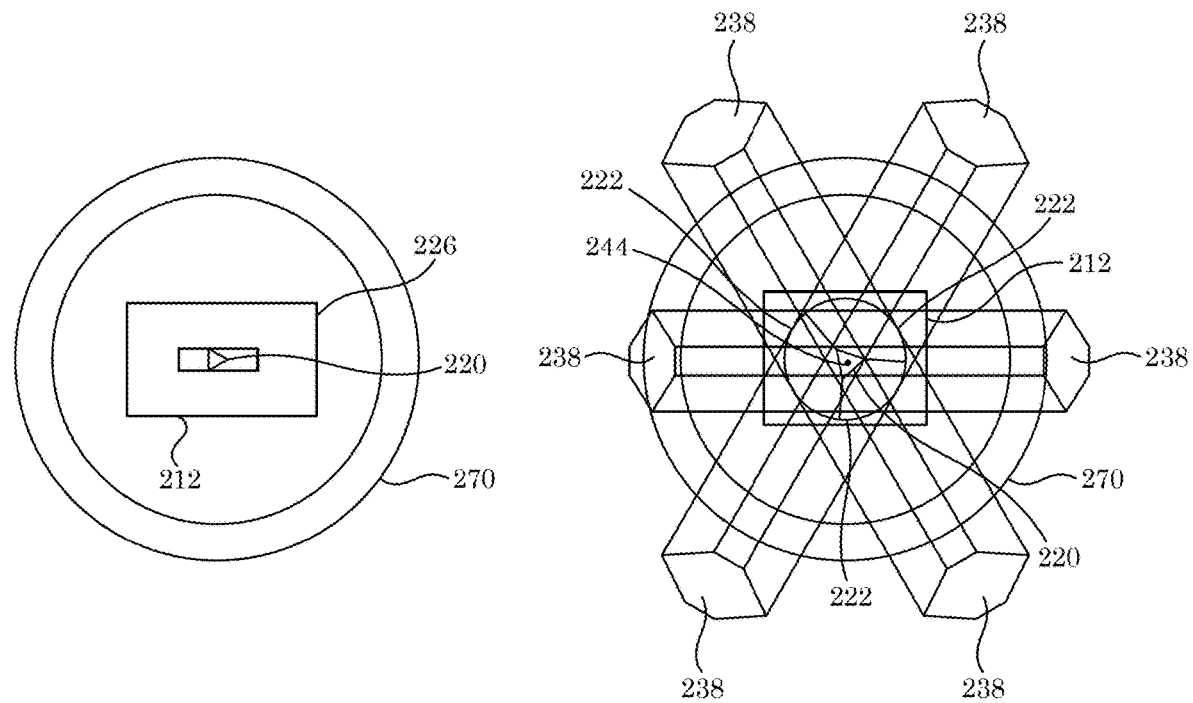

A detailed description of one or more embodiments is presented herein by way of exemplification and not limitation.

It has been discovered that uniaxial counter-propagating monolaser atom trap 200 and processes herein provide slowing, cooling, and trapping atoms with a single laser beam. Atoms are slowed by a slower and trapped in the intersection of optical beams produced by an optical diffractor. In an embodiment, with reference to FIG. 1, FIG. 2, FIG. 3, FIG. 4, FIG. 5, FIG. 6, FIG. 7, FIG. 8, and FIG. 9, uniaxial counter-propagating monolaser atom trap 200 includes: atom source 226 that provides primary atoms 228, such that primary atoms 228 move in atom primary direction 246; light source 260 opposing atom source 226 and that produces primary light 236, primary light 236 propagating in light primary direction 248, light primary direction 248 opposing atom primary direction 246 such that primary light 236 counter-propagates relative to primary atoms 228; atom slower 210 interposed between atom source 226 and light source 260 and that: receives primary atoms 228 from atom source 226; receives primary light 236 as slowing light 262; subjects primary atoms 228 to slowing light 262; and slows primary atoms 228 to form slowed atoms 232 from primary atoms 228 in response to interaction of primary atoms 228 with slowing light 262, slowed atoms 232 moving in atom primary direction 246; optical diffractor 212 interposed between atom slower 210 and light source 260 and including: diffraction surface 214 opposing light source 260; slower surface 216 opposing atom source 226; atom transfer wall 218 that bounds atom transfer aperture 220; atom transfer aperture 220 that communicates slowed atoms 232 to trapping region 244 from atom slower 210 and communicates primary light 236 to atom slower 210 from trapping region 244; a plurality of diffraction gratings 222 disposed on diffraction surface 214 and including: first diffraction grating 222.1 that receives primary light 236 from light source 260 and produces first reflected light 238.1 from primary light 236, first reflected light 238.1 moving in first light reflection direction 250.1; second diffraction grating 222.2 that receives primary light 236 from light source 260 and produces second reflected light 238.2 from primary light 236, second reflected light 238.2 moving in second light reflection direction 250.2; and third diffraction grating 222.3 that receives primary light 236 from light source 260 and produces third reflected light 238.3 from primary light 236, third reflected light 238.3 moving in third light reflection direction 250.3; trapping region 244 interposed between optical diffractor 212 and light source 260 and that: receives first reflected light 238.1, second reflected light 238.2, and third reflected light 238.3 such that first reflected light 238.1, second reflected light 238.2, and third reflected light 238.3 intersect in reflected light intersection volume 224 in trapping region 244 to form trap light 240 from first reflected light 238.1, second reflected light 238.2, and third reflected light 238.3; receives slowed atoms 232 in trap light 240; and produces trapped atoms 234 from slowed atoms 232 in response to subjecting slowed atoms 232 to trap light 240.

Figure 5:
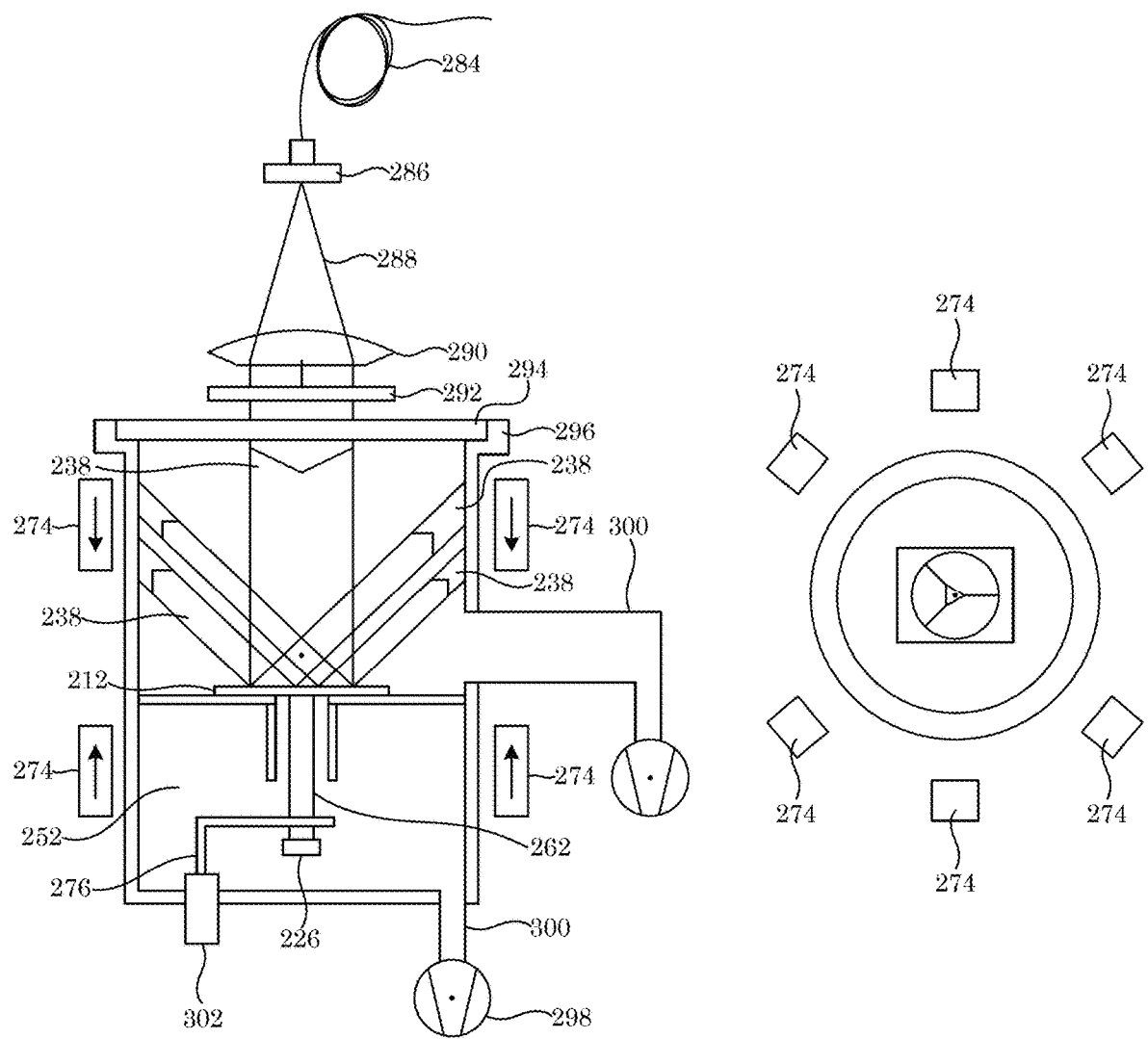
FIG. 5 shows a uniaxial counter-propagating monolaser atom trap.
Figure 6:
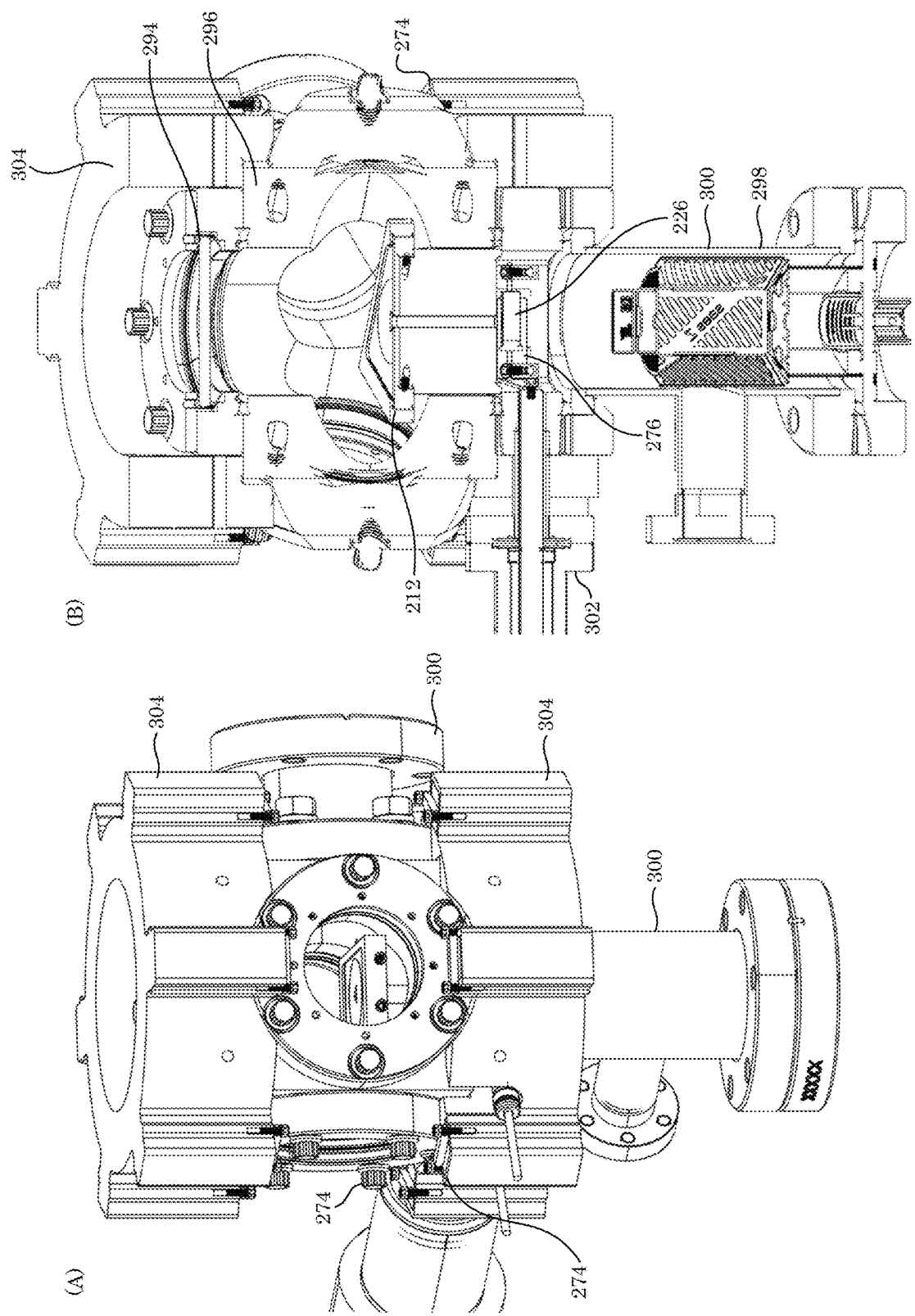
FIG. 6 shows a uniaxial counter-propagating monolaser atom trap.
Figure 7:
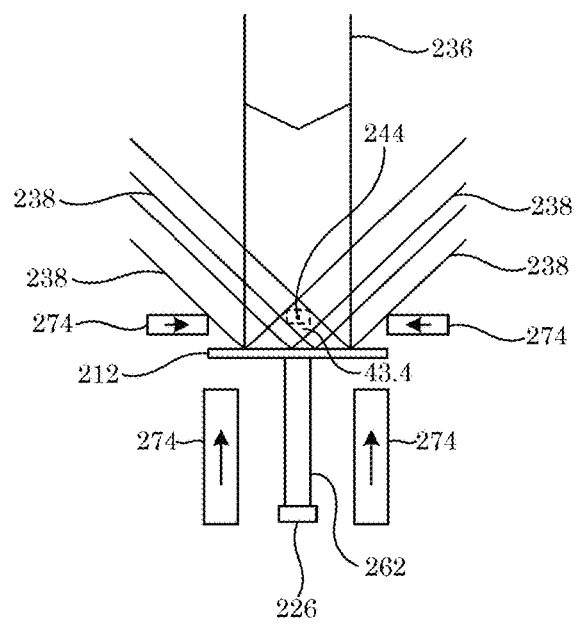
FIG. 7 shows a uniaxial counter-propagating monolaser atom trap.
Figure 7:
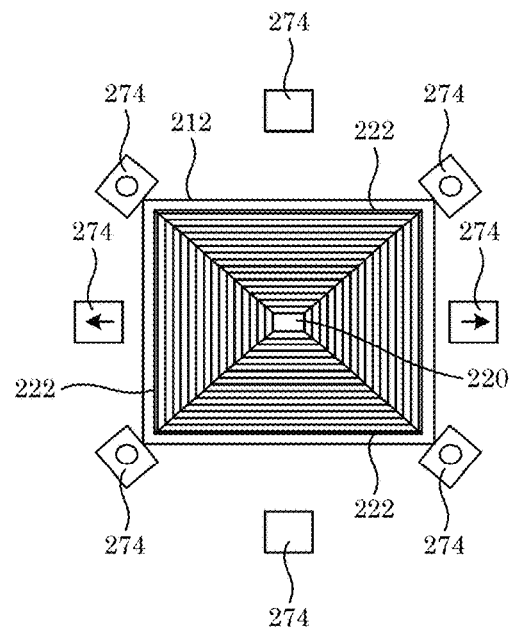
Figure 8:
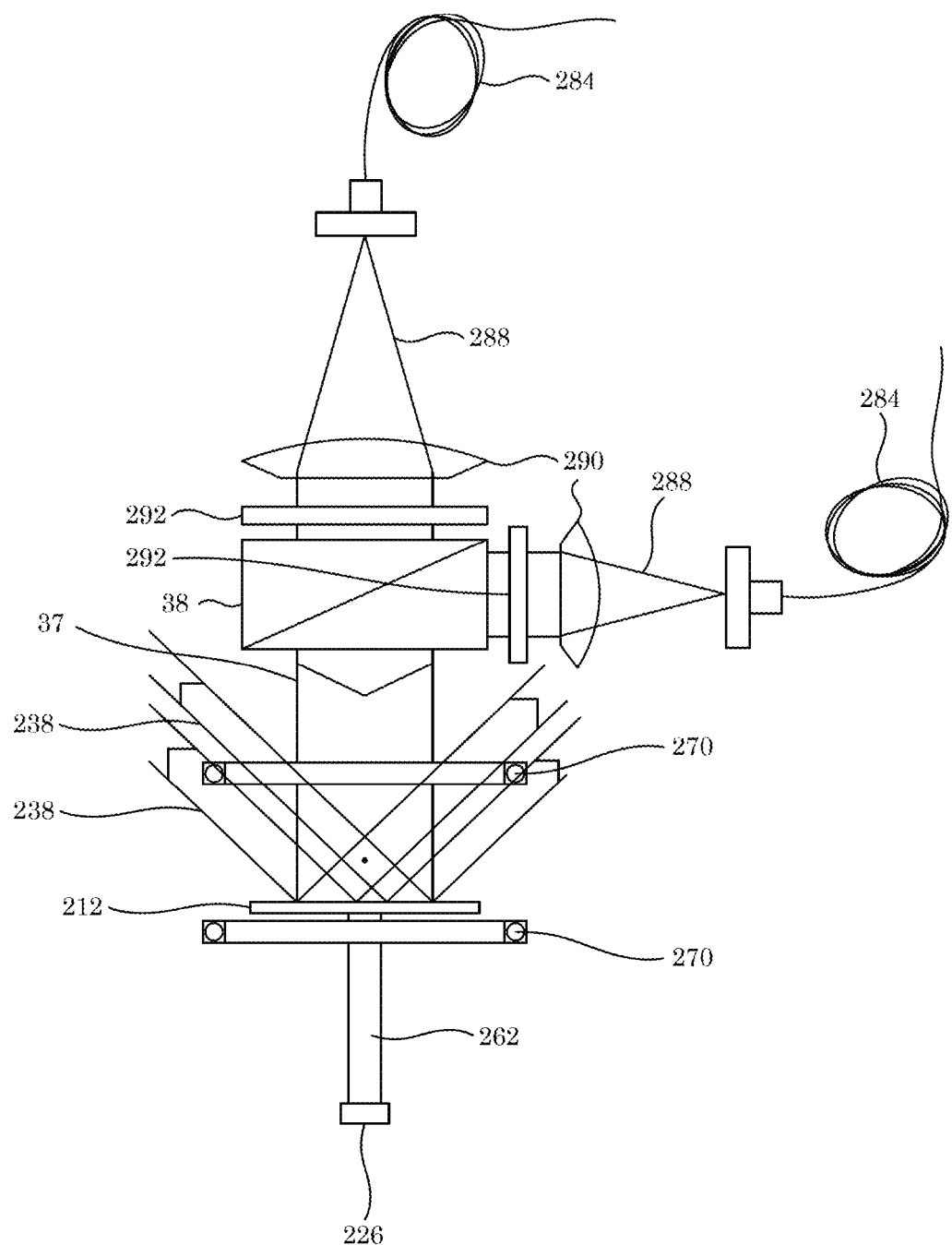
FIG. 8 shows a uniaxial counter-propagating monolaser atom trap.

Atom source 226 produces primary atoms 228. It is contemplated that atom source 226 can include an oven, heater, and the like to produce a vapor or increase a vapor pressure of a selected atom, atomic ion, molecule, or molecular ion. It should be appreciated that the phrase "primary atom" includes the atom, atomic ion, molecule, molecular ion, or combination thereof produced by atom source 226. Atom source 226 can include a slit, nozzle, tube, and the like to direct flow of the atom, atomic ion, molecule or molecular ion. Moreover, the total flux of primary atoms 228 or other species can be less than an amount of flux such that scattering of primary atoms 228 or other species causes scattering of trapped atoms 234 that does not exceed the rate of conversion of primary atoms 228 into trapped atoms 234 by slowing primary atoms 228. Exemplary atom sources 226 include metallic ovens, getter dispensers, metal dispensers, and ablation sources. In an embodiment, atom source 226 includes a titanium-encased alkali metal dispenser. With reference to FIG. 5, uniaxial counter-propagating monolaser atom trap 200 can include shutter 276 interposed between atom source 226 and trapping region 244 to interrupt communication of primary atoms 228 from atom source 226 to trapping region 244. Rotational actuator 302 can be in communication with shutter 276 to position shutter 276 in or out of the beam of primary light 236 or to completely isolate atom source 226 from trapping region 244.

Primary atoms 228 can include an atomic, atomic ion, molecule, or molecular ion species in vapor form and physically capable of being slowed and cooled using lasers. As used herein, physically capable of being slowed refers to the internal level structure of primary atom 288 having repeated scattering of photons from slowing light 262 and trap light 240. Exemplary primary atoms 228 include alkali atoms such as lithium, sodium, potassium, rubidium, cesium and francium; alkaline earth atoms such as magnesium, calcium, and strontium; select species of lathanides or actenides such as dysprosium, erbium, and ytterbium; metastable noble gasses such as helium, argon, and xenon; alkaline-fluoride molecules such as magnesium fluoride, calcium fluoride, strontium fluoride; and molecules such as boron monohydride and the like. A velocity distribution of primary atoms 228 can include a velocity component that can be slowed by slowing light 262 and subsequently trapped by trap light 240. A total flux of primary atoms 228 can be from 1 to $10^{20}$ s$^{-1}$. A maximum angular distribution of primary atoms 228 can be 4π steradians, specifically up to the angular opening of the atomic transfer wall 218, and more specifically to the maximum initial angle, dependent on velocity, whose trajectory is slowed by slowing light 262 and trapped by trap light 240. In an embodiment, primary atoms 228 includes alkali atoms communicated, with a thermal velocity distribution, from an alkali metal effusive source.

Decelerating atoms 230 include a subset of primary atoms 228 that are slowed by slower light 262. A flux of decelerating atoms 230 can be from 1 to $10^{20}$ s$^{-1}$, specifically from 1 s$^{-1}$ to $10^{15}$ s$^{-1}$, and more specifically from $10^6$ s$^{-1}$ to $10^{12}$ s$^{-1}$. In an embodiment, decelerating atoms 230 includes a fraction of primary atoms 228 whose velocity is small enough to be decelerated by slowing light 262.

Slowing light 262 can include a light source that slows primary atoms 228 and can include single frequency laser light, multiple-frequency laser light, white light, chirped frequency laser light, and the like. Exemplary slowing lights 262 include laser light slightly detuned from an atomic transition or laser light whose frequency is chirped to maintain resonance with decelerating atoms 230. Moreover, slowing light 262 can include a combination of types of light in order to drive transitions in primary atoms 228. A wavelength of slowing light 262 can be from 100 nm to 15000 nm, specifically from 350 nm to 2000 nm, and more specifically from 350 nm to 1500 nm. A ratio of intensity to the saturation intensity of the transition in primary atom 228 of slowing light 262 can be from $10^{-9}$ to $10^6$, specifically from $10^{-3}$ to $10^3$, and more specifically from 0.1 to 10. Intensity can refer to the amount of intensity in any frequency component of slowing light 262 driving any transition in primary atom 228. A ratio of the frequency detuning of any particular frequency component of slowing light 262 from its relevant transition in primary atom 228 to the natural linewidth of the transition in primary atom 228 can be from −100 to 100, more specifically from −10 to 10, and more specifically from −2 to 0. In an embodiment, primary atoms 228 include lithium atoms, and slowing light 262 includes a circularly polarized, single frequency laser light that is red-detuned from a transition between $2S_{1/2}(F=2)$ to $2P_{3/2}(F'=3)$ to twice that of a natural linewidth of the $2P_{3/2}$ state with an intensity twice that of the saturation intensity of the $2P_{3/2}$ state.

Slowed atoms 232 can include decelerated atoms 230 that interact with trapping light 240 after traversing atom the atom transfer aperture 240. Moreover, primary atoms that are not slowed may not interact with the trapping light 240 and pass through the trapping region 244. A flux of slowed atoms 232 can be from 1 to $10^{20}$ s$^{-1}$, specifically from 1 s$^{-1}$ to $10^{15}$ s$^{-1}$, and more specifically from $10^6$ s$^{-1}$ to $10^{12}$ s$^{-1}$. A velocity distribution of slowed atoms 232 can be such that a fraction of slowed atoms, after interacting with trapping light 240, will become trapped atoms 234. In an embodiment, slowed atoms 232 include decelerated atoms 230 traversing the atomic aperture 240.

Slower field 256 can include a magnetic or electric field, oscillating or constant in time, or any combination thereof, independently or in conjunction with slowing light 262 that decelerates primary atom 228. Exemplary slower fields 256 include a time-constant magnetic field whose spatial shape varies in proportion to the $\sqrt{z}$, where z is the position along the axis defined by the slowing light (Zeeman slower). This exemplary field can maintain resonance between slower light 262 and decelerating atoms 230 via the Zeeman effect, delivering the maximum possible acceleration throughout their trajectory. A maximum field strength of slower field 256 can be from 1 G to 10 T, specifically from 1 G to 10 kG, and more specifically from 1 G to 200 G. In an embodiment, slower field 256 includes a magnetic field that varies in proportion to z, maintaining resonance with slowing light 262.

Decelerating atoms 230, slowing light 262, slowed atoms 232, and slower field 256 are disposed in atom slower 210. Moreover, atom slower 210 can include slower member 258 interposed between atom source 226 and optical diffractor 212. Slower member 258 can include magnetic field coils 270, permanent magnet 274, voltage electrode, or a combination thereof. In an embodiment, with reference to FIG. 2 and FIG. 3, atom slower 210 is a Zeeman slower 266. Here, slower member 258 is magnetic field coils 270 that produces a spherical magnetic quadrupole field. It is contemplated that magnetic field coils 270 are disposed in atom slower 210 and trapping region 244 to provide a continuous field between atom slower 210 and trapping region 244. In an embodiment, with reference to FIG. 5 and FIG. 6, uniaxial counter-propagating monolaser atom trap 200 includes a plurality of permanent magnet 274 disposed around atom slower 210 and trapping region 244.

Magnetic field coils 270 can include electrical conductors wound to produce or contribute to slower field 256 or trapping field 254 upon application of electric current. Exemplary magnetic field coils 270 include wires wound onto multiple circular forms, wires wound to form solenoids or tapered solenoids, or copper conductors deposited onto substrates and subsequently etched. Moreover, multiple magnetic field coils 270 can be used in conjunction to produce or contribute to slower field 256 or trapping field 254. Moreover, magnetic field coils 270 can include wiring used to connect multiple circular forms or copper conductors. In an embodiment, with reference to FIG. 3, magnetic field coils 270 includes twelve copper spirals with eight turns and rectangular cross section 0.025 in. wide by 0.012 in. high, disposed on plate mount 270 and connected together with copper wire and solder.

Permanent magnet 274 can include a material with a permanent magnetization that can be positioned such that it can produce or contribute to slower field 256 or trapping field 254. Exemplary permanent magnets 274 include neodymium-iron magnets. A field strength produced by permanent magnet 274 can be from 1 G to 10 kG. In an embodiment, permanent magnet 274 includes rectangular parallelepiped neodymium-iron magnets with ½"×½"×1½" dimensions. In an embodiment, with reference to FIG. 7, first permanent magnet 274.1 is interposed between optical diffractor 212 and light source 260 and provides an axial magnetic field directed along the light primary direction 248; and second permanent magnet 274.2 is interposed between optical diffractor 212 and light source 260 and provides a two-dimensional magnetic field gradient along light primary direction 248. It is contemplated that first permanent magnet 274.1 also can be interposed between optical diffractor 212 and atom source 226 and can provide an axial magnetic field directed along the light primary direction 248.

Magnet mount 304 can be any mechanically rigid system that mechanically mounts permanent magnets 274. In an embodiment, with respect to FIG. 6, magnet mount 304 is a 3D-printed polylactic acid form that holds six ½"×½×1½" magnets in a hexagonal configuration.

The voltage electrode can include a conductivity plate, wire, tube or the like positioned either in free space or on a substrate to produce an electric field that assists in trapping, by exerting a force on primary atom 228 or by providing a Stark shift in primary atom 228 that provide laser cooling with slowing light 262 or trap light 240. Exemplary voltage electrodes include four parallel copper tubes positioned rectangularly in free space. Moreover, the electric field produced by the voltage electrode can be constant in time or oscillating. A field strength produced by the voltage electrode can be from 0 V/cm to 1 kV/cm, and specifically from 10 V/cm to 500 V/cm.

Figure 3:
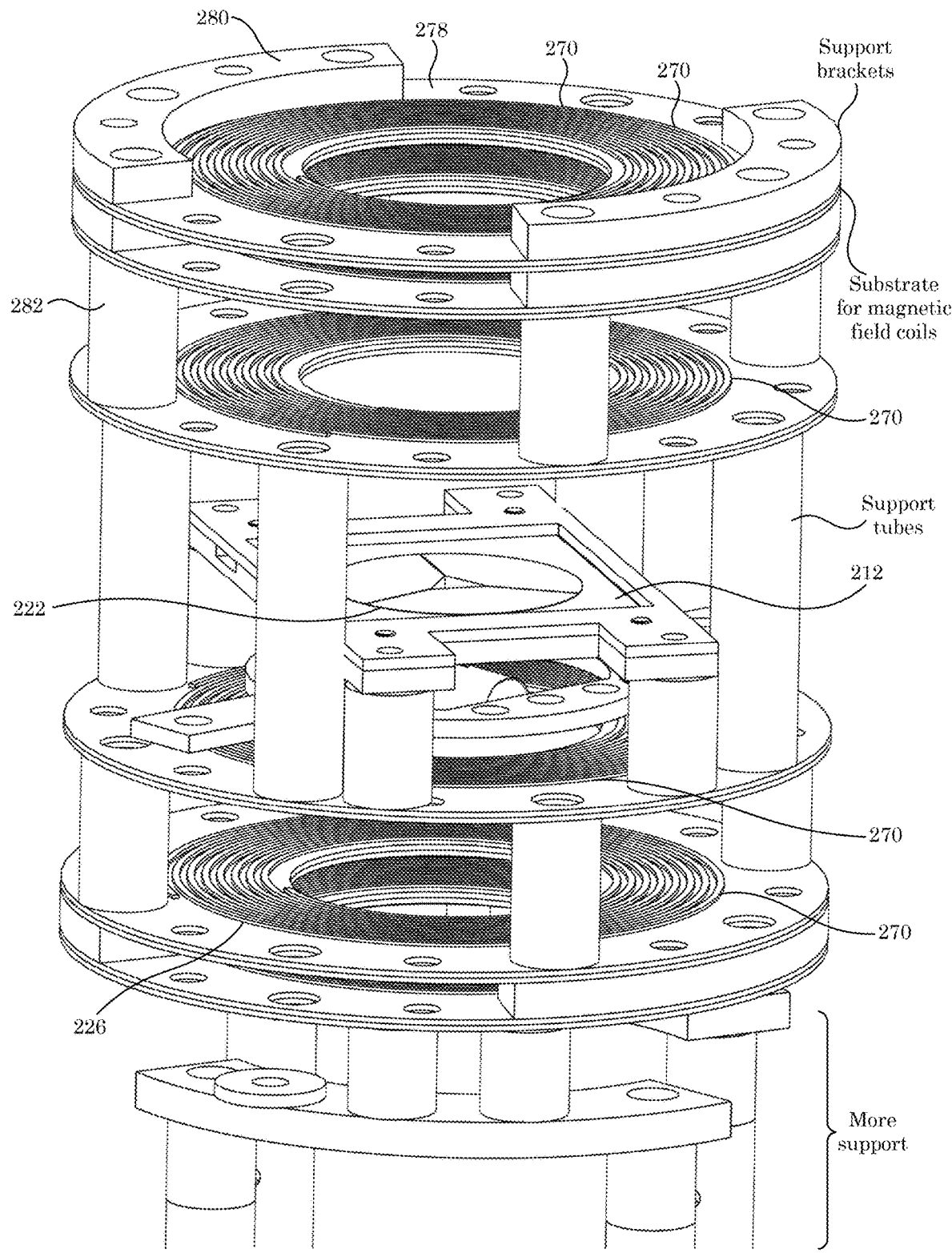
FIG. 3 shows a uniaxial counter-propagating monolaser atom trap.

With reference to FIG. 3, slower member 258, e.g., magnetic field coils 270, permanent magnet 274, or voltage electrodes, can be mechanically supported by mounting plate 278 disposed on plate mount 280 and spaced apart by spacer 282. Mounting plate 278 can be a compatible substrate capable of hold magnetic field coils 250, permanent magnet 274 or voltage electrodes and can be aluminum nitride, sapphire, or other metal substrate and can be any shape. Moreover, mounting plates have sufficient thermal stability and conduct away heat dissipated by elements attached. In an embodiment, mounting plate 278 includes circular aluminum nitride boards with a center cut-out for primary light 236 to pass and mounting holes spaced along its outer circumference. Plate mount 280 can include a metallic or insulating material to mechanically attach and space mounting plates 278. Exemplary plate mounts include copper or aluminum flats with mounting holes. Moreover, the thermal conductivity of plate mount 280 can be equal to or greater than that of mounting plate 278 to provide dissipation of heat. In an embodiment, plate mount 280 includes toroidal sections with square cross sections with vertically passing through holes, allowing for mechanical connection to mounting plate 278 using machine screws and nuts. Spacer 282 can include a tube or rod with a cross section for mechanically attaching and spacing mounting plates 278. Exemplary spacers include copper tubes and aluminum rods. Moreover, the thermal conductivity of spacer 282 can be equal to or greater than that of mounting plate 278 to assist with the dissipation of heat. In an embodiment, spacer 282 includes copper tubes with outer diameter 7.62 mm and inner diameter 4.5 mm and with various lengths to allow appropriate spacing of mounting plates 278.

Figure 4:
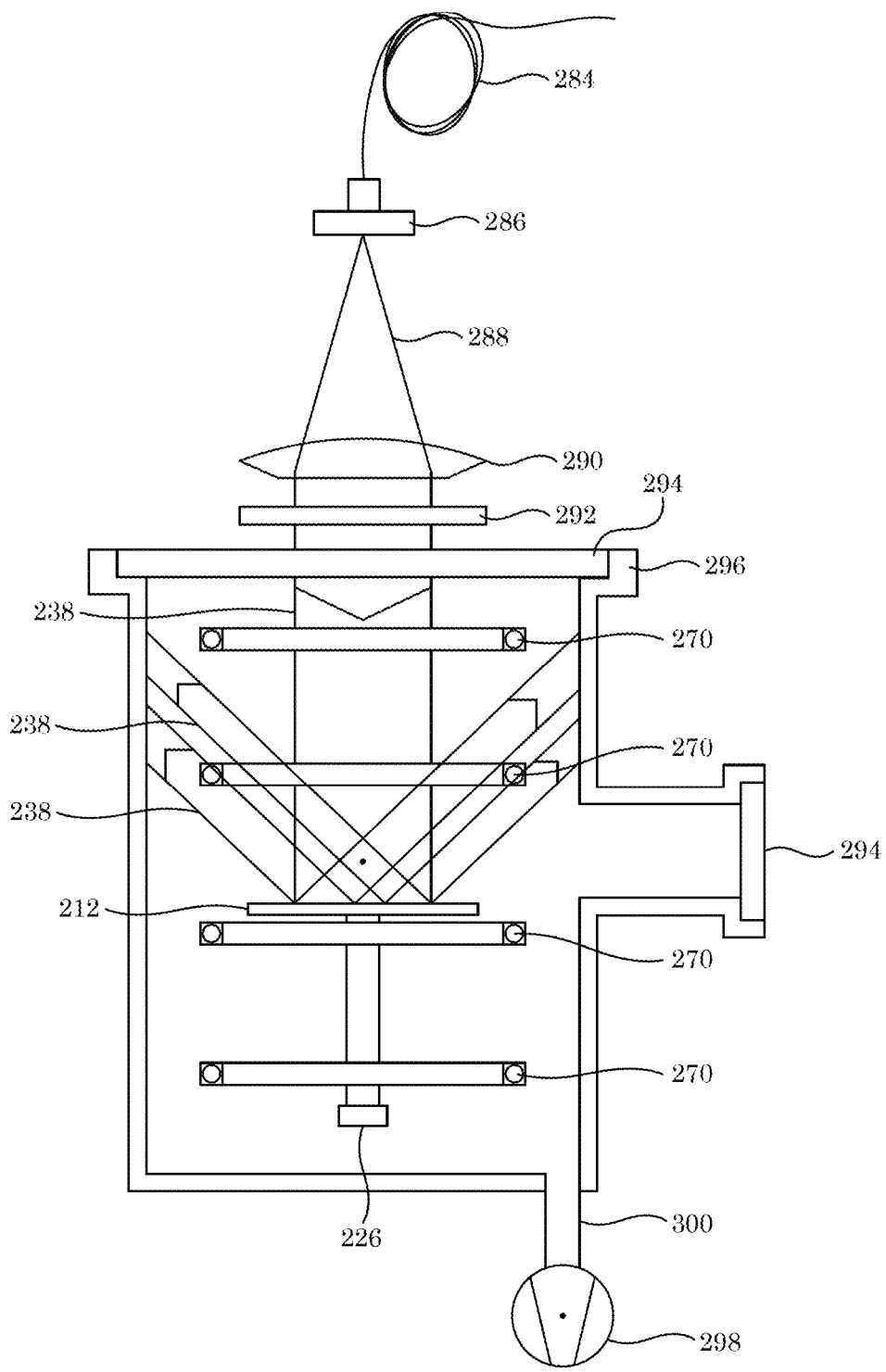
FIG. 4 shows a uniaxial counter-propagating monolaser atom trap.

In an embodiment, with reference to FIG. 4, uniaxial counter-propagating monolaser atom trap 200 includes optical fiber 284 through which primary light 236 is communicated. Optical manipulation of primary light 236 is accomplished by communicating primary light 236 through optical fiber 284 and optical coupler 286 that forms divergent beam 288 for primary light 236 with subsequent communication of primary light 236 through lens 290 and waveplate 292 to form primary light 236 that is collimated or polarized-selected.

Uniaxial counter-propagating monolaser atom trap 200 can include vacuum chamber 296 that includes viewport 294 to receive and communicate primary light 236 to trapping region 244. vacuum chamber 296 can be in communication with vacuum pump 298 via vacuum connection 300 to achieve a selected pressure in vacuum chamber 296. As a base pressure, the pressure in vacuum chamber 296 can be from $10^{-18}$ torr to $10^{-7}$ torr, specifically from $10^{-15}$ torr to $10^{-7}$ torr, and more specifically from $10^{-12}$ torr to $10^{-8}$ torr in an absence of primary atoms 228, slowed atoms 232, or trapped atoms 234. It is contemplated that the pressure in vacuum chamber 296 can be from $10^{-15}$ torr to $10^{-6}$ torr, specifically from $10^{-10}$ torr to $10^{-8}$ torr in presence of primary atoms 228, slowed atoms 232, or trapped atoms 234. Further, atom slower 210 and trapping region 244 can be subject to differential pumping through atom transfer aperture 220. It is contemplated that flow tube 252 is disposed on slower surface 216 and opposing atom source 226. In this manner, flow tube 252 can receive slowed atoms 232 from atom slower 210 and communicates slowed atoms 232 from atom slower 210 to trapping region 244 through atom transfer aperture 220. Flow tube 252 can include a tube, aperture, pinhole, or an opening to constrict flow of gas in a molecular flow regime between atom slower 210 and trapping region 244. A length of flow tube 252 along light primary direction 248 can be from infinitesimally small to the length of atom slower 210. The opening of flow tube can be from 10 um to 10 mm, specifically between 1 mm and 5 mm. Moreover, flow tube 252 can be constructed in such a way to allow for mechanical mounting of optical diffractor 212, with reference to FIG. 6. In an embodiment, flow tube 252 includes an aluminum right cylinder of dimensions that include 18.69 mm outer diameter and 28.15 mm long with a 3 mm diameter through hole and mounting hardware to mechanically secure optical diffractor 212.

Optical diffractor 212 can include a chip, plate, or wafer that can be etched or formed to create a reflective diffraction grating 222 and can be a silicon, glass, and the like. Exemplary optical diffractors 212 include nanofabricated silicon chips, individual gratings on glass substrates cut and glued together. Moreover, optical diffractor 212 can contain atom transfer wall 218 bounding the atom transfer aperture 220. A thickness relative to light primary direction 248 of optical diffractor 212 can be from 100 μm to 5 mm, specifically from 400 μm to 2 mm, and more specifically from 450 μm to 550 μm. In an embodiment, optical diffractor 212 includes a nanofabricated silicon chip, wherein multiple diffraction gratings 222 and atom transfer wall 218 are formed by chemical etching of the silicon chip and subsequently finished by depositing metal. Chemical etching could include plasma reactive ion etching, inductively coupled reactive ion etching, wet etching, and the like.

Diffraction grating 222 can include a reflective periodic structure to create one or more beams upon reflection of primary light 236. Exemplary diffraction gratings 222 include ruled, linear gratings, holographic gratings, or gratings made from the periodic arrangement of more complicated shapes. Moreover, diffraction grating 222 minimizes zero-order or retro-reflection. The bounding region of diffraction grating 222 on optical diffractor 212 can be a selected, arbitrary shape. In an embodiment, diffraction grating 222 can be bound by a circle of radius 11 mm. A ratio of the spacing of periodic structures and the average wavelength of primary light 226 can be from 1 to 50, specifically from 1.001 to 10, and more specifically from 1.01 to 2, the latter resulting in diffraction angles from 80° to 45°. A diffraction efficiency can be engineered by choosing a reflective material to provide a correct amount of power in reflected light 238 after reflection of primary light 236. The diffraction efficiency can be unbalanced between positive and negative orders by using a blazed or otherwise asymmetric grating. In an embodiment, diffraction grating 222 includes an 100 nm aluminum-coated, linear grating with square-wave cross section with period 1000 nm, 50% duty cycle, and depth 168 nm, resulting in diffraction angles of 42 degrees, no second order diffraction, and minimum zero order diffraction with average wavelength 671 nm primary light 236.

Figure 9:
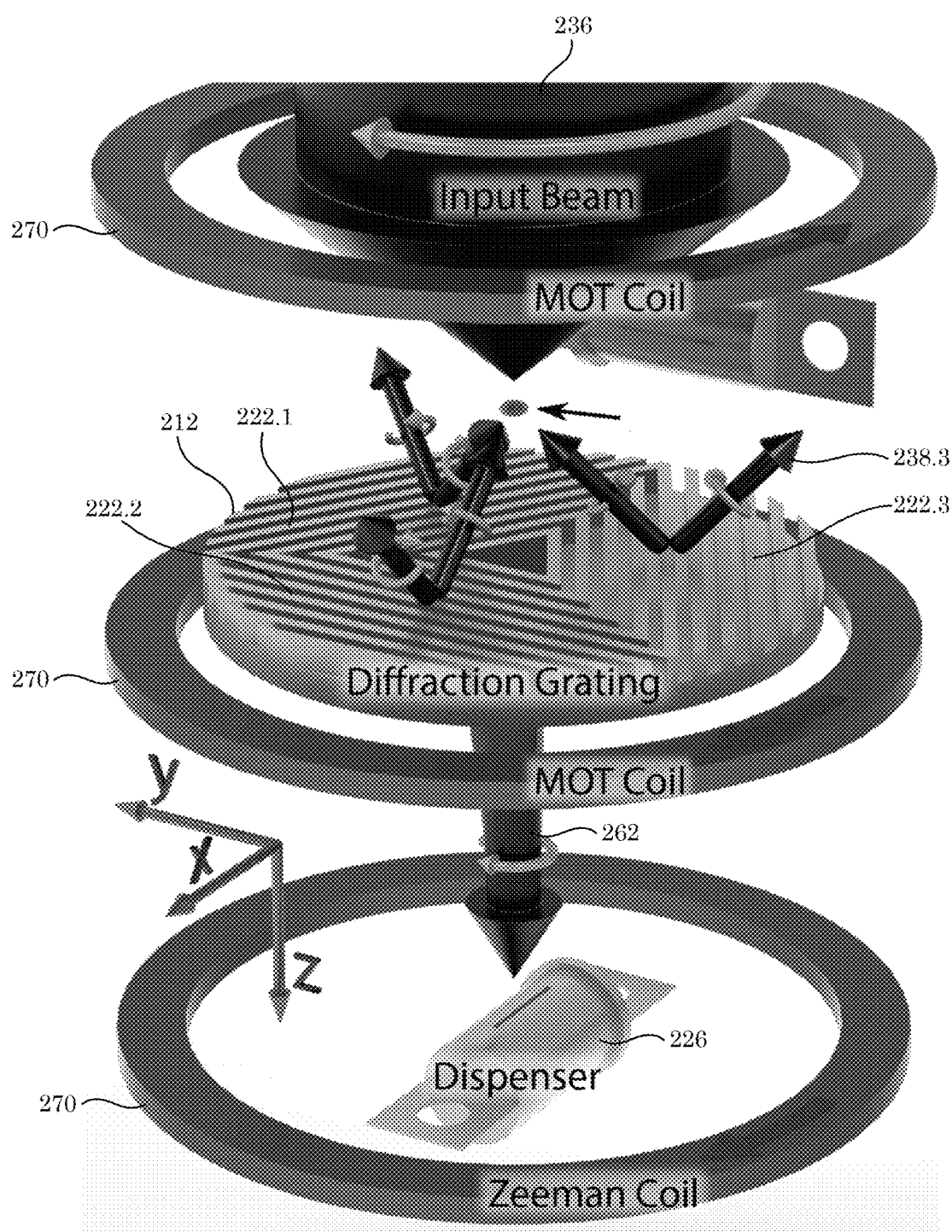
FIG. 9 shows a uniaxial counter-propagating monolaser atom trap.
Figure 10:
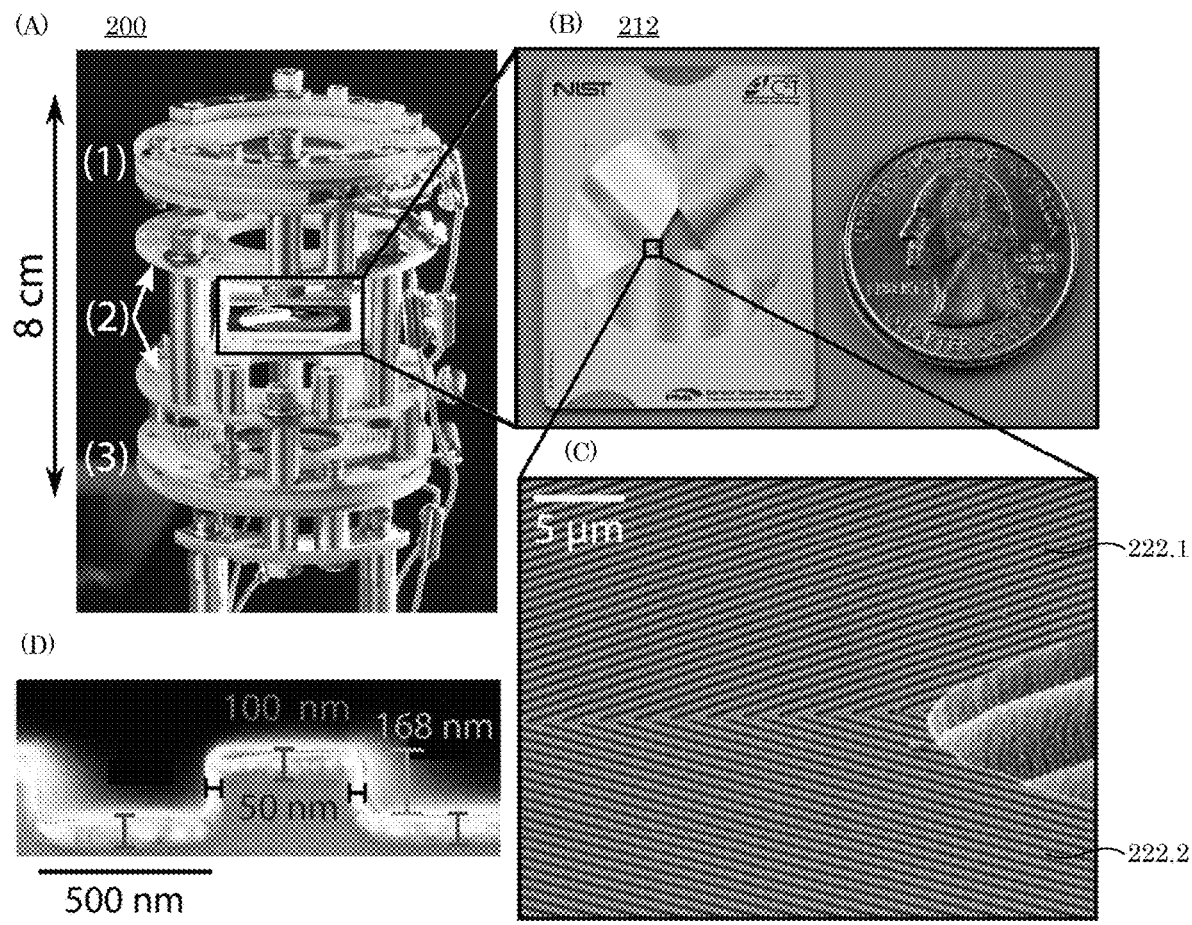
FIG. 10 shows a uniaxial counter-propagating monolaser atom trap in panel A, an optical diffractor in panel B, a cross-section through the optical diffractor in panel C, and a diffraction surface of the optical diffractor.

With reference to FIG. 9 and FIG. 10, first diffraction grating 222.1 can include a first set of linear grating lines 268.1; the second diffraction grating 222.2 comprises a second set of linear grating lines 268.2; and the third diffraction grating 222.3 comprises a third set of linear grating lines 268.3. According to an embodiment, the first set of linear grating lines 268.1, the second set of linear grating lines 268.2, and the third set of linear grating lines 268.3 are arranged on diffraction surface 214 in three truncated triangles, wherein atom transfer aperture 220 is centrally disposed among the three truncated triangles. In an embodiment, with reference to FIG. 7, optical diffractor 212 further includes fourth diffraction grating 222.4 that receives primary light 236 from light source 260 and produces fourth reflected light 238.4 from primary light 236, fourth reflected light 238.4 moving in fourth light reflection direction 250.4, and has a rectangle or square shape.

Figure 15:
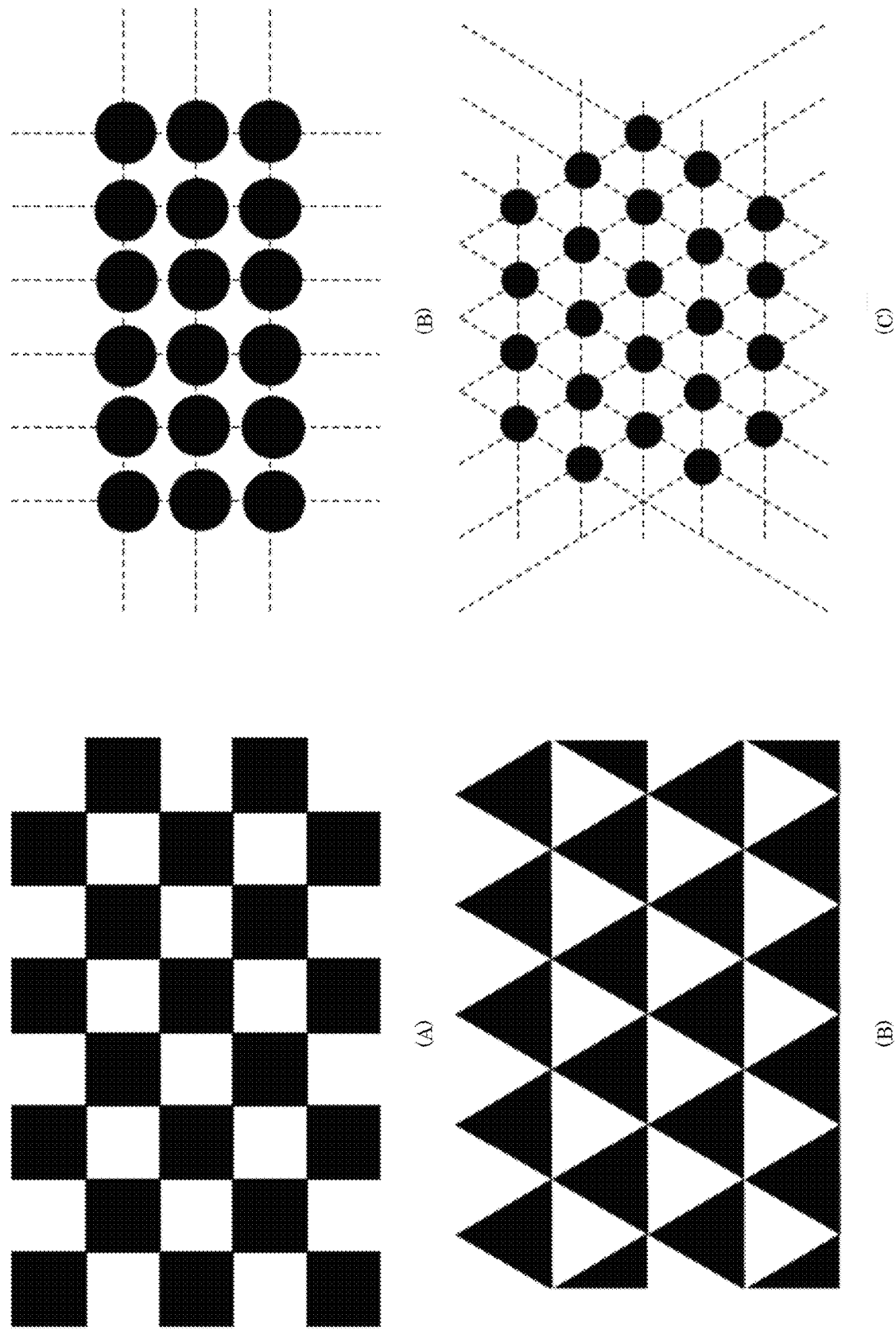
FIG. 15 shows exemplary shapes and patterns of elements in diffraction gratings.

With reference to FIG. 15, diffraction gratings of two-dimensional periodic structures can be used as diffraction gratings 222. In an embodiment with respect to FIG. 15(A) and FIG. 15(B), four beams are made from the single diffraction grating. In an embodiment with respect to FIG. 15(C) and FIG. 15(D), six beams are made. Here, the diffraction grating is made by forming (e.g., by etching) periodic patterns of certain shapes (e.g., polygons, squares (panel A), circles (panel B), triangles (panel C), circles (panel D), and the like) in selected regions of a substrate. FIG. 15 shows such diffraction gratings, wherein black regions are etched regions of the substrate; white space is exposed substrate; and dashed lines are for reference to show periodocity.

Reflected light 238 is derived from primary light 236 reflected by diffraction grating 222 and can include polarization rotations, intensity changes and beam shaping required by trap light 240. Moreover, reflected light 238 has the same wavelength spectrum as primary light 236 and can include a wavelength spectrum of trap light 240. The force at zero magnetic or electric field and for a trapped atom 234 with zero velocity exerted by all reflected lights 238 and in the direction of light primary direction 248 balances an opposing force exerted by primary light 236 over the entire trapping region 244. This condition is met if $N_b \eta = 1$, where $N_b$ is the number of reflected light beams and $\eta$ is the diffraction efficiency of diffraction grating 222, and assuming a flat-top input beam profile for primary light 236. The product of $N_b \eta$ of reflected light 238 in the trapping region 244 can be from 0.5 to 1.5, specifically from 0.75 to 1.25. In an embodiment, reflected light 238 includes spectral components of primary light 236, with opposite circular polarization, and an intensity specified by a diffraction efficiency of $\eta = 0.38$, with $N_b = 3$.

Reflected light intersection volume 224 includes the volume formed by the intersection of all reflected beams 238 whose directions, in the plane orthogonal to the axis defined by light primary direction 248, oppose one another. A volume of reflected light intersection volume 224 can be from $10^2$ to $10^5$ mm$^3$, specifically from 100 to 5000 mm$^3$, and more specifically from 1000 to 2000 mm$^3$. Moreover, the volume is dependent on the number of reflected light beams and their specific geometry.

Trapping region 244 is disposed in reflected light intersection volume 224. Trapping region 244 also can include magneto-optical trap 264. Magneto-optical trap 264 uses a spherical quadrupole trapping field 254 in combination with circularly-polarized trap light 240 which together form a trap for the trapped atoms 234.

Trap light 240 is formed in reflected light intersection volume 224 and includes reflected beams 238 within the intersection region whose directions 250 oppose one another along with primary light 236. Together, the beams exert forces on the atoms along the three spatial dimensions. Moreover, the trap light has the appropriate wavelength or frequency and polarization for the type of trap being created. In an embodiment, with respect to FIG. 2, FIG. 3, FIG. 4, FIG. 5, FIG. 6, trap light 240 is light whose frequency is slightly smaller than that of the internal transition of the trapped atoms 234 and are circularly polarized.

Trapped atoms 234 can include the subset of primary atoms from the atom source that have been decelerated, traversed the atom transfer aperture 220, and trapped in the trap light 240. A number of trapped atoms 234 can be from 1 to $10^{10}$, specifically from $10^4$ to $10^9$, and more specifically from $10^6$ to $10^8$. A velocity distribution of trapped atoms 234 can be thermal, with the ultimate temperature is limited by the properties of the trapping field 254 and trap light 240. A temperature of trapped atoms 234 can be from 1 µK to 100 mK, specifically from 10 µK to 10 mK. In an embodiment, trapped atoms 234 includes laser-cooled atoms held in a magneto-optical trap at temperatures of the order of 100 µK.

Trapping field 254 can include any magnetic field, that in conjunction with or independently of trapping light 240 is capable of trapping the atoms. Exemplary trapping fields 254 that work in conjunction with trapping light include spherical quadrupole fields where $$B = -\frac{B'}{2}(x\hat{x} + y\hat{y}) + B'z\hat{z},$$

where z is the axial position from the center of the trap, and x and y are the orthogonal in-plane positions, and B' is the magnetic field gradient. A field gradient B' of a spherical quadrupole trapping field 254 can be from 5 G/cm to 500 G/cm, specifically from 10 G/cm to 50 G/cm, and more specifically from 15 G/cm to 45 G/cm. Exemplary trapping field 254 that work independently of trapping light include magnetic bottle trap fields given by $B = B'(x\hat{x} - y\hat{y}) + (B_0 + B_2 z^2/2)\hat{z}$. Moreover, the fields generated may vary in time and switch between those that work in conjunction and independently with trapping light 240. In an embodiment, with reference to FIG. 2, FIG. 3, FIG. 4, FIG. 5, and FIG. 6, trapping field 254 includes a spherical quadrupole trap with B'=45 G/cm. In an embodiment with respect to FIG. 7, trapping field 254 includes a magnetic bottle trap with $B_0$=50 G, B'=100 G/cm, and $B_2$=100 G/cm$^2$.

Primary light 236 is formed in light source 260 and includes frequency components, powers, and polarizations of trap light 240 and slowing light 262. In an embodiment using lithium atoms as primary atom 228, primary light 236 includes a laser beam with two frequency components with frequencies 12 MHz red-detuned from resonance with the $2S_{1/2}(F=2)$ to $2P_{3/2}(F'=3)$ cycling transition and the $2S_{1/2}$ (F=1) to $2P_{3/2}(F'=2)$ repump transition. Both components are circularly polarized and have an intensity equal to twice that of the saturation intensity of the transition.

Light source 260 produces primary light 236 and can include lasers, fibers, white-light sources, and other compatible components that produce primary light 236 with frequencies, polarizations, and powers. Exemplary light sources 260 include diode lasers. Moreover, depending on application, the light source can be made of combinations of lasers and other devices such as acousto-optic modulators, electro-optic modulators, and the like. In an embodiment, light source 260 includes 671 nm diode lasers and Ti: Sapphire lasers with acousto-optic modulators and spectroscopy cells to produce primary light 262 and its necessary frequency components. In an embodiment, with reference to FIG. 8, light source 260 produces a first primary light 236.1 and second primary light 236.2 that are combined into primary light 236, wherein second primary light 236.2 includes a frequency that is chirped for slowing primary atoms 228. Here, first primary light 236.1 and second primary light 236.2 are combined by beam combiner 306.

Further, vacuum pump 298 sustains the base vacuum levels described above. Exemplar vacuum pumps include turbomolecular pumps, ion pumps, Ti:sublimation pumps, or non-evaporable getter pumps. In an embodiment, with respect to FIG. 6, vacuum pump 298 connected to the atom slower is a 400 L/s non-evaporable getter pump.

Uniaxial counter-propagating monolaser atom trap 200 can be made in various ways. In an embodiment, a process for making uniaxial counter-propagating monolaser atom trap 200 includes: forming optical diffractor 212; disposing optical diffractor 212 in vacuum chamber 296; disposing atom source 226 on vacuum chamber 296; and aligning light source 260 so that primary light 236 propagates along light primary direction 248 such that light primary direction 248 is normal to optical diffractor 212.

In an embodiment, a process for making optical diffractor 212 includes providing a substrate, e.g., a silicon wafer; forming a photomask of a pattern for diffraction grating 222 with direct laser writing or electron beam lithography; spin coating and baking a photoresist on the substrate; exposing the substrate to light through the photomask to cross-link a resist in specific positions provided by photomask locations; developing the resist; transferring the photoresist pattern onto the substrate via reactive ion plasma etching; dissolving the photoresist; forming atom transfer aperture 220 atomic aperture by lithography followed by deep silicon reactive etch; and optionally sputtering a thin layer of metal, e.g., aluminum on the substrate to form optical diffractor 212. Optical diffractor 212 can include that has greater than 10,000 etched triangles spaced approximately 1 micrometer (μm) apart with 0.5 μm width and a triangular atom transfer aperture 220 centrally disposed on slower surface 216. The etch depth of the grating can be, e.g., about 168 nm to reduce zero-order reflection. It is contemplated that the metal coating can be, e.g., 100 nm thick.

The process for making uniaxial counter-propagating monolaser atom trap 200 also can include disposing flow tube 252 and separating vacuum chamber 296 into separate regions connected through flow tube 252, disposing a vacuum connection 300 and vacuum pump 298 onto both vacuum regions, and establishing independent vacuum pumping in atom slower 210 and trapping region 244.

Uniaxial counter-propagating monolaser atom trap 200 has numerous advantageous and unexpected benefits and uses. In an embodiment, a process for cooling and trapping atoms with the uniaxial counter-propagating monolaser atom trap 200 includes: providing primary atoms 228 from atom source 226, such that primary atoms 228 move in atom primary direction 246; producing, by light source 260, primary light 236, primary light 236 propagating in light primary direction 248, light primary direction 248 opposing atom primary direction 246; counter-propagating primary light 236 relative to primary atoms 228; receiving, by atom slower 210, primary atoms 228 from atom source 226; communicating primary light 236 to atom slower 210 from trapping region 244; receiving, by atom slower 210, primary light 236 as slowing light 262; subjecting primary atoms 228 to slowing light 262; slowing primary atoms 228 by slowing light 262; forming slowed atoms 232 from primary atoms 228 in response to interaction of primary atoms 228 with slowing light 262, slowed atoms 232 moving in atom primary direction 246; communicating, by atom transfer aperture 220, slowed atoms 232 to trapping region 244 from atom slower 210 receiving, by first diffraction grating 222.1, primary light 236 from light source 260; producing, by first diffraction grating 222.1, first reflected light 238.1 from primary light 236, first reflected light 238.1 moving in first light reflection direction 250.1; receiving, by second diffraction grating 222.2, primary light 236 from light source 260; producing, by second diffraction grating 222.2, second reflected light 238.2 from primary light 236, second reflected light 238.2 moving in second light reflection direction 250.2; receiving, by third diffraction grating 222.3, primary light 236 from light source 260; producing, by third diffraction grating 222.3, third reflected light 238.3 from primary light 236, third reflected light 238.3 moving in third light reflection direction 250.3; receiving, by trapping region 244, first reflected light 238.1, second reflected light 238.2, and third reflected light 238.3; intersecting first reflected light 238.1, second reflected light 238.2, and third reflected light 238.3 in reflected light intersection volume 224 in trapping region 244; forming trap light 240 from first reflected light 238.1, second reflected light 238.2, the third reflected light 238.3; receiving slowed atoms 232 in trap light 240; and subjecting slowed atoms 232 to trap light 240 to produce trapped atoms 234 from slowed atoms 232.

In an embodiment, the process can include producing slower field 256, wherein trapping field 254 is in communication with Zeeman atom slower 210. A magnetic field gradient of trapping field 254 extends into atom slower 210 by magnetic field coils 270. Zeeman atom slower 210 includes slower field 256 that is a magnetic field that scales as a square root of position to maximize efficiency in slowing primary atoms 228 and production of slowed atoms 232, wherein a magnetic field profile is selectively tailored to change smoothly from a linear magnetic field to a square-root magnetic field. According to an embodiment, the magnetic field is produced, e.g., in-vacuum by copper coils directly bonded to aluminum-nitride substrates.

Uniaxial counter-propagating monolaser atom trap 200 and processes disclosed herein have numerous beneficial uses, including measurement of vacuum pressure, inertial sensing, frequency or wavelength standards, clocks, quantum information transmission, quantum-enhanced sensing, and the like. Advantageously, uniaxial counter-propagating monolaser atom trap 200 overcomes limitations of technical deficiencies of conventional articles such as standard six beam atom traps, which occupy large volumes, involve more laser power, and are more sensitive to misalignments of laser beams. Further, using a single beam to generate both trapping and slower with differential pumping across a flow tube offers vacuum advantages such as separated a 2D MOT loading a 3D MOT through a differential pumping tube and significantly reduces power requirements. Further, compared to conventional single-beam magneto-optical traps like grating MOTs, pyramid MOTs, or the like, the uniaxial counter-propagating monolaser atom trap 200 differential pumping across flow tube 252 offers better vacuum properties. Further, conventional articles using single-beam traps and differential pumping require more than one beam, which is overcome by uniaxial counter-propagating monolaser atom trap 200.

Moreover, uniaxial counter-propagating monolaser atom trap 200 and processes herein have numerous advantageous properties. In an aspect, embodiments with shutter 276 can have significantly longer lifetimes compared conventional apparatus by controlling the source of primary atoms 228. Primary atoms 228 that are not slowed and trapped can scatter with trapped atoms 234 and cause ejection of the latter. This process can limit the lifetime of the atom traps of conventional single-beam atom traps. Longer lifetimes in uniaxial counter-propagating monolaser atom trap 200 is advantageous for , inertial sensing, frequency or wavelength standards, clocks, quantum information transmission, quantum-enhanced sensing, and the like.

Uniaxial counter-propagating monolaser atom trap 200 and processes herein unexpectedly loads significantly more atoms into the trap than conventional single beam traps because the slower captures higher velocity and more abundant primary atoms. Moreover, uniaxial counter-propagating monolaser atom trap 200 provides extended interaction of primary atoms with slower light, reducing saturation effects from other beams, increasing the force, and further increasing the maximum velocity of primary atoms that can be trapped, relative to trapping in conventional articles where all slowing force and trapping force are imparted via trap light 240.

The articles and processes herein are illustrated further by the following Example, which is non-limiting.

EXAMPLE

Single-Beam Zeeman Slower and Magneto-Optical Trap Using a Nanofabricated Grating We describe a compact (0.25 L) system for laser cooling and trapping atoms from a heated dispenser source. The system includes a nanofabricated diffraction grating to generate a magneto-optical trap (MOT) using a single input laser beam. An aperture in the grating allows atoms from the dispenser to be loaded from behind the chip, increasing the interaction distance of atoms with the cooling light. To take full advantage of this increased distance, we extend the magnetic field gradient of the MOT to create a Zeeman slower. The MOT traps approximately $10^6$ Li atoms emitted from an effusive source with loading rates greater than $10^6$ $s^{-1}$. Our design is portable to a variety of atomic and molecular species and could be a principal component of miniaturized cold-atom-based technologies.

Miniaturized cold-atom systems may form the basis of a host of emerging quantum technologies, from quantum repeaters to clocks. Such miniaturized systems will likely employ a magneto-optical trap (MOT) for initial cooling and trapping of atoms. Conventional MOTs confine an atomic gas near the center of a quadrupole magnetic field in the overlap region of three pairs of counterpropagating laser beams. Due to the number of laser beams, MOTs typically have expansive optical layouts with a large number of mechanical degrees of freedom. Even mobile experiments that incorporate MOTs have a size on the order of 1 m. To fully realize the potential of cold-atom-based quantum technologies beyond the laboratory environment, the size and robustness of MOTs need to be improved.

Previous research on MOT miniaturization has focused on elements that can be trapped from a room-temperature background vapor, namely Cs or Rb. However, many other elements can be laser cooled and each have advantages for various quantum technologies. For example, Sr or Yb can be used as a highly accurate clock. Lithium, due to its low mass, has been identified as a possible sensor atom for primary vacuum gauges and, given its large recoil energy, could find use in cold-atom gravity gradiometers. Most atoms, including Li, do not have an appreciable vapor pressure at room temperature and thus are typically loaded from a heated dispenser. Here, we present the design of a compact laser cooling and trapping apparatus for Li that integrates a MOT with a Zeeman slower and includes a single input laser beam. FIG. 9 shows the apparatus.

FIG. 9 shows the experimental apparatus. Straight arrows indicate the input and diffracted laser beams. Curved arrows wrapping each laser beam indicate circular polarization. The copper rings represent electromagnets and the attached black arrows show the direction of current flow. The two MOT coils form a quadrupole magnetic field, while the Zeeman coil increases the magnetic field behind the diffraction grating. Lithium atoms that leave the heated dispenser are slowed by the single laser beam behind the grating and then captured by the MOT. The second dispenser in the background illustrates a side-loading configuration. The axes of ensuing figures refer to the coordinate system shown here. The gravitational force is antiparallel to the $\hat{z}$ axis.

MOT miniaturization is based on early experiments using pyramidal retroreflectors or tetrahedral laser-beam arrangements. These pyramidal and tetrahedral MOT configurations allow the formation of a MOT using a single external laser beam and a compound reflective optic. In the tetrahedral geometry, the compound optic can be fully planarized by replacing the reflectors with diffraction gratings (see FIG. 9). Both grating and pyramidal MOTs have been demonstrated to trap large numbers of atoms and cool them below the Doppler limit. Pyramidal MOTs have been made into single-beam atom interferometers. Grating MOTs have found use as magnetometers and electron-beam sources. The optics for both MOT types are amenable to nanofabrication. Nanofabricated pyramidal MOTs are inferior to grating MOTs in two key areas. First, grating MOTs form above the nanofabricated grating chip, making the laser-cooled atoms easier to manipulate and detect. Second, the fabricated optics of a grating MOT are planar, making grating MOTs fully compatible with atom chips and photonics.

The atom loading rate R of a MOT depends strongly on the capture velocity vc. Namely, $R \propto (v_c/v_p)^4$, where the constant of proportionality depends on the total flux from the source and $v_p = \sqrt{2k_B T/m}$ is the most probable thermal velocity of particles with temperature T and mass m ($k_B$ is Boltzmann's constant). While difficult to calculate a priori, a reasonable upper limit on vc is given by the maximum atomic velocity that can be stopped in a distance ds (typically the radius rb of a MOT laser beam) by the radiation force, i.e., $v_c < \sqrt{d_s \hbar k \Gamma/m}$, where $k=2\pi/\lambda$ is the wave number of the cooling light with wavelength $\lambda$, $\Gamma$ is the decay rate of the excited state, and $\hbar$ is the reduced Planck constant. The corresponding figure of merit for R is then ($d_s \hbar k \Gamma$/

$2k_BT)^2$, assuming the same source output flux. Lithium's figure of merit is among the worst of all laser-coolable atoms, with its red cooling wavelength of $\lambda_{Li}\approx671$ nm, its linewidth of $\Gamma_{Li}\approx2\pi\times6$ MHz, and its typical source operating temperature $T\approx700$ K.

Lithium's poor figure of merit is worsened when loading a grating MOT directly from a dispenser. For simplicity, the dispenser could be placed to the side to avoid blocking laser beams (see FIG. 9). This placement results in $d_s\leq\sqrt{2}r_b$ for a conventional six-beam MOT, but only $d_s\leq r_b/2$ for a grating MOT. Moreover, a dispenser placed to the side of a grating MOT will tend to deposit metal on the grating, gradually reducing its performance.

Another MOT performance metric is steady-state atom number $N_S=R\tau$, where $\tau$ is the trap lifetime. To achieve the same output flux, different elements require different source temperatures, T. Higher-temperature sources outgas undesired species at a rate that is exponential in T. These undesired species can collide with trapped atoms, reducing $\tau$.

The device herein integrated a tetrahedral MOT configuration with a Zeeman slower by etching an aperture in the grating and loading the atoms from behind. Light passing through the aperture in the chip can interact with the counterpropagating atoms for a greater distance, increasing ds (see FIG. 9). By tailoring the magnetic field behind the chip, we make a Zeeman slower to capture atoms with higher initial velocity. The aperture can also limit gas flow, allowing for differential pumping that mitigates the effects of dispenser outgassing.

A nanofabricated silicon diffraction grating chip forms the core of the device, as shown in FIG. 2(a). The grating chip, fabricated using photolithography at the National Institute of Standards and Technology in the Center for Nanoscale Science and Technology (CNST) NanoFab cleanroom facility, includes three one-dimensional diffraction gratings, which are arranged so that their grooves form concentric equilateral triangles [see FIG. 10(b) and (c)]. Each grating has a period $p=1.00(5)\mu m$ and a 500(10) nm trench width [see FIG. 10(d)]. The gratings are cropped by an outer circle with a diameter of 22 mm. The diffraction gratings have a first-order diffraction angle $\theta_d\approx42°$ at $\lambda_{Li}$. The grating trenches are etched to a depth of 168(2) nm (approximately $\lambda_{Li}/4$), chosen to minimize zero-order reflections. A 100(5) nm layer of aluminum is deposited on the chip surface via sputtering. The thickness of the aluminum coating was selected to yield, at $\lambda_{Li}$, the optimum first-order diffraction efficiency of 33% for a triangular-grating MOT; we measure 37(1)%. Higher-order diffraction is suppressed because $p<2\lambda_{Li}$. For normally incident, circularly polarized light, the normalized Stokes parameters of the first-order diffracted beam are $Q=0.03(1)$, $U=0.13(1)$, $V=0.84(1)$. A triangular aperture, defined by an inscribed circle of radius 1.5 mm, allows both light and atoms to pass through the chip.

With regard to FIG. 10, cooling and trapping apparatus for Li is shown, wherein a picture of the full device including compensation coils, MOT coils, and Zeeman coils. The atom dispenser is concealed by the Zeeman coils, but its approximate position is shown in FIG. 9. Panel shows the 27 mm×35 mm diffraction-grating chip. Panel (c) shows a scanning-electron-microscope (SEM) image of the diffraction grating near a vertex of the triangular aperture. Panel (d) shows an edge-on SEM image with critical dimensions.

Three sets of electromagnets produce magnetic fields [see FIG. 10(a)]. Set (2) is an anti-Helmholtz pair that produces the magnetic field gradient needed for the MOT. Set (3) extends the range of the magnetic field beyond the chip and adapts it into the square-root profile of a Zeeman slower. The antisymmetric set prevents the field from set (3) from shifting the MOT axially. All sets were made from direct bond copper on an aluminum-nitride substrate.

A Li dispenser included a stainless-steel tube filled with 15 mg of unenriched Li. The dispenser emits atoms through a 5 mm×0.1 mm rectangular slit. Assuming an operating temperature of 375° C., the dispenser can operate continuously for approximately 200 days before exhausting its Li supply. The trapping system can include a three-dimensionally printed titanium dispenser that can hold more than 100 mg of Li [40], allowing at least 500 days of continuous operation.

The full 0.25-L assembly was constructed on a vacuum flange and inserted into a vacuum chamber pumped by a 50 L/s ion pump. The vacuum chamber has a base pressure of $3(1)\times10^{-8}$ Pa. Outgassing from the Li source causes the pressure to increase to approximately $10^{-6}$ Pa.

The single intensity-stabilized laser beam strikes the grating normally. It has a $1/e^2$ radius of 20(1) mm; an iris stops the beam to fit the grating. The center frequency of the laser is detuned relative to the $2S_{1/2}(F=2)$ to $2P_{3/2}(F'=3)$ cycling transition, which has a saturation intensity of $I_{sat}\approx2.54$ mW/cm². An electro-optic modulator adds sidebands at approximately 813 MHz; the +1 sideband is equally detuned from the $2S_{1/2}(F=1)$ to $2P_{3/2}(F'=2)$ repump transition. Because the MOT magnetic field gradient continuously deforms into the magnetic field of the Zeeman slower, an additional slowing laser would not improve atom capture. The intensities 1 reported herein are the carrier intensity at the center of the incident beam. Fluorescence from the MOT is continuously monitored by a camera along an axis orthogonal to the cooling beam. The same camera also records absorption images to more accurately measure the number of trapped atoms.

FIG. 11(a) shows images of the cloud of $^7$Li atoms trapped in the MOT after various expansion times t. The diffraction grating was not visible in the images, as the MOT formed approximately 4 mm from the chip. The fitted 1/e radii of the cloud, shown in FIG. 11(b), followed $w^2(t)=w_0^2+(2k_BT_{MOT}/m)t^2$, where $T_{MOT}$ is the temperature of the trapped cloud and $w_0$ is the initial radius. The measured temperatures are 900(50) μK in the radial direction and 590(30) μK in the axial direction. For the data in FIG. 11(a) and (b), the laser detuning is $\Delta/\Gamma_{Li}=-2.0$, the saturation parameter is $s_0=I/I_{sat}=3.6$, the carrier-to-repump power ratio is about 3:2, the magnetic field gradient at the center of the MOT is B'=4.5 mT/cm, and the peak magnetic field of the Zeeman slower is $B_{max}\approx12$ mT. These trapping parameters and the extracted temperatures are similar to those of "compressed" Li MOTs.

Figure 11:
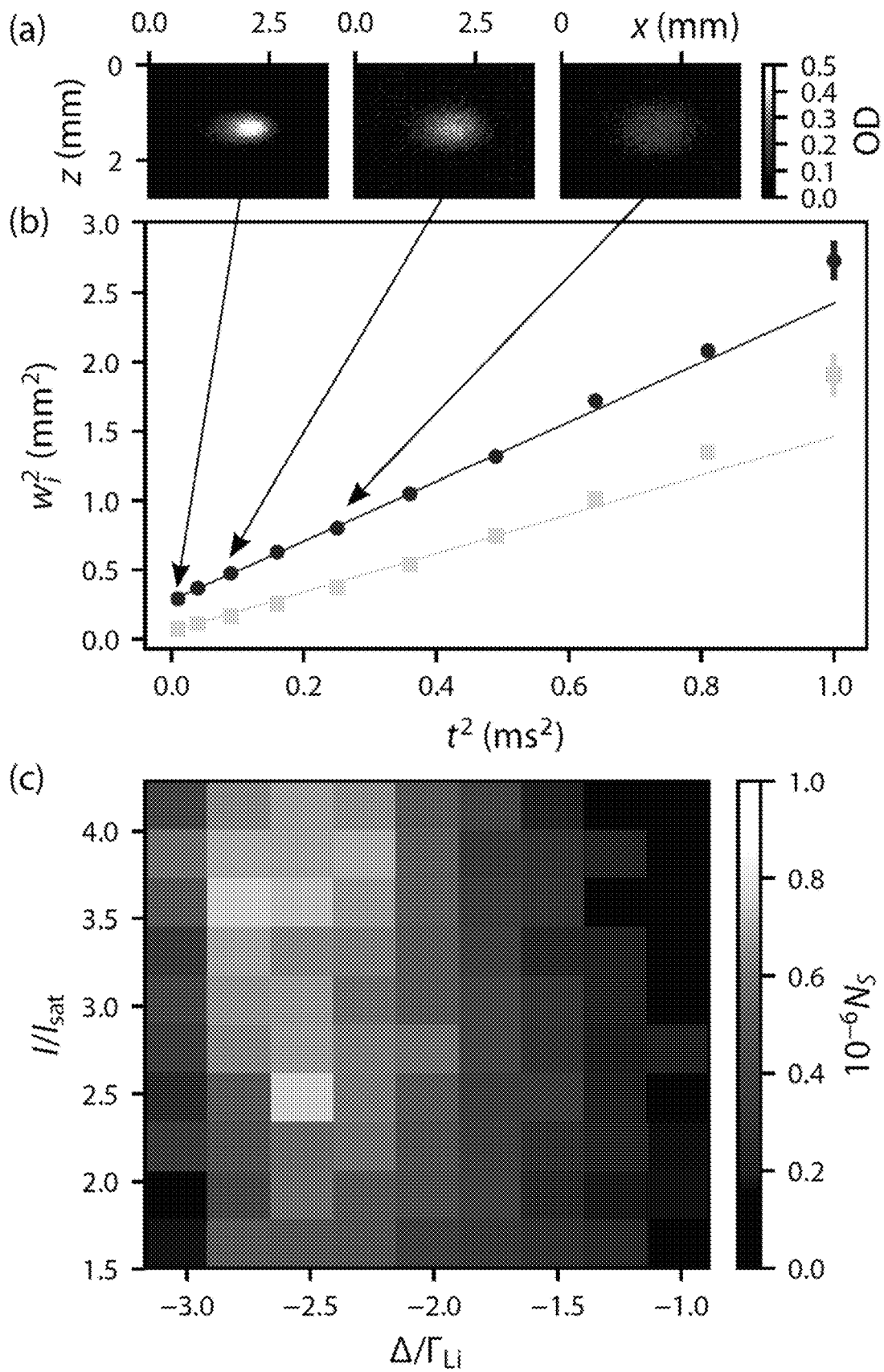
FIG. 11 shows a absorption images in panel A, a graph of squared radii versus squared time in panel B, and a graph of laser tuning versus intensity for steady-state atom numbers in panel C.

With reference to FIG. 11, panel (a) shows absorption images of optical density (OD) of the $^7$Li cloud at three different expansion times t. Panel (b) shows fitted x and z squared 1/e radii $w_{i=x,z}^2$ of the cloud versus $t^2$ (most error bars are smaller than the data points). Panel (c) steady-state atom number $N_S$ versus the laser detuning and intensity, in units of $\Gamma_{Li}$ and $I_{sat}$, respectively. Here, panel (c) provides equilibrium atom number NS in the MOT as a function of the detuning and intensity of the laser beam. The magnetic field gradient, the peak field of the Zeeman slower, and the carrier-to-repump ratio are the same as in FIG. 11(a) and (b). The captured atom number increases with the laser intensity and begins to saturate at $I/I_{sat}\approx2.5$. We find that the maximum atom number occurs near a detuning of $\Delta/\Gamma_{Li}\approx-2.5$. Varying the carrier-to-repump power ratio between 1:1 and 2:1 does not qualitatively change the results in FIG. 11(c) or substantially affect the maximum atom number.

There is not a distinct laser beam for the Zeeman slower so the MOT loads atoms during operation. However, we can shut off the current in the Zeeman and compensation coils [see FIG. 9 and FIG. 10(a)] to reduce the MOT loading rate. The MOT population then exponentially decays to a lower equilibrium atom number. Fitting the MOT decay curves yields trap lifetimes $\tau \approx 1$ s for our operating conditions.

To quantitatively understand the loading of the MOT, we calculate the average force f exerted on an atom by the input beam, with wave vector $k_0$, and its reflections, with wave vector $k_i$ (=1,2,3), using $$f = \sum_{i=0}^{3} \hbar k_i \Gamma \sum_{m'_L=-1}^{1} \frac{s_i P(m'_L, \gamma_i, \epsilon_i)}{1 + s_{total} + 4\delta_i^2/\Gamma^2}, \quad (1)$$

$$\delta_i = \Delta - k_i \cdot v - m'_L \mu_B B / \hbar,$$

where we have assumed an S-to-P transition (i.e., ignoring fine and hyperfine structure). Here, $s_i = I_i/I_{sat}$ is the saturation parameter for beam i (with intensity $I_i$), $s_{total} = \Sigma s_i$, $\Delta$ is the detuning, v is the atom's velocity, $\mu_B$ is the Bohr magneton, $m_L$ 40 is the projection of the excited-state's orbital angular momentum onto the magnetic field, and $\gamma_i$ is the angle between the magnetic field B and the wave vector $k_i$. The polarization of beam i is denoted by $\epsilon_i = \pm 1$, where +1 (−1) represents right-handed (left-handed) circular polarization. P is a Wigner d-matrix that determines the transition probabilities to excited state $m_L$ and is given by $P(m_L'=-1, \gamma_i, \epsilon_i=\pm 1) = (1 \mp \cos \gamma_i)^2/4$, $P(m_L'=0, \gamma_i, \epsilon_i=\pm 1) = \sin^2\gamma_i/2$, and $P(m_L'=+1, \gamma_i, \epsilon_i=\pm 1) = (1 \pm \cos \gamma_i)^2/4$.

Figure 12:
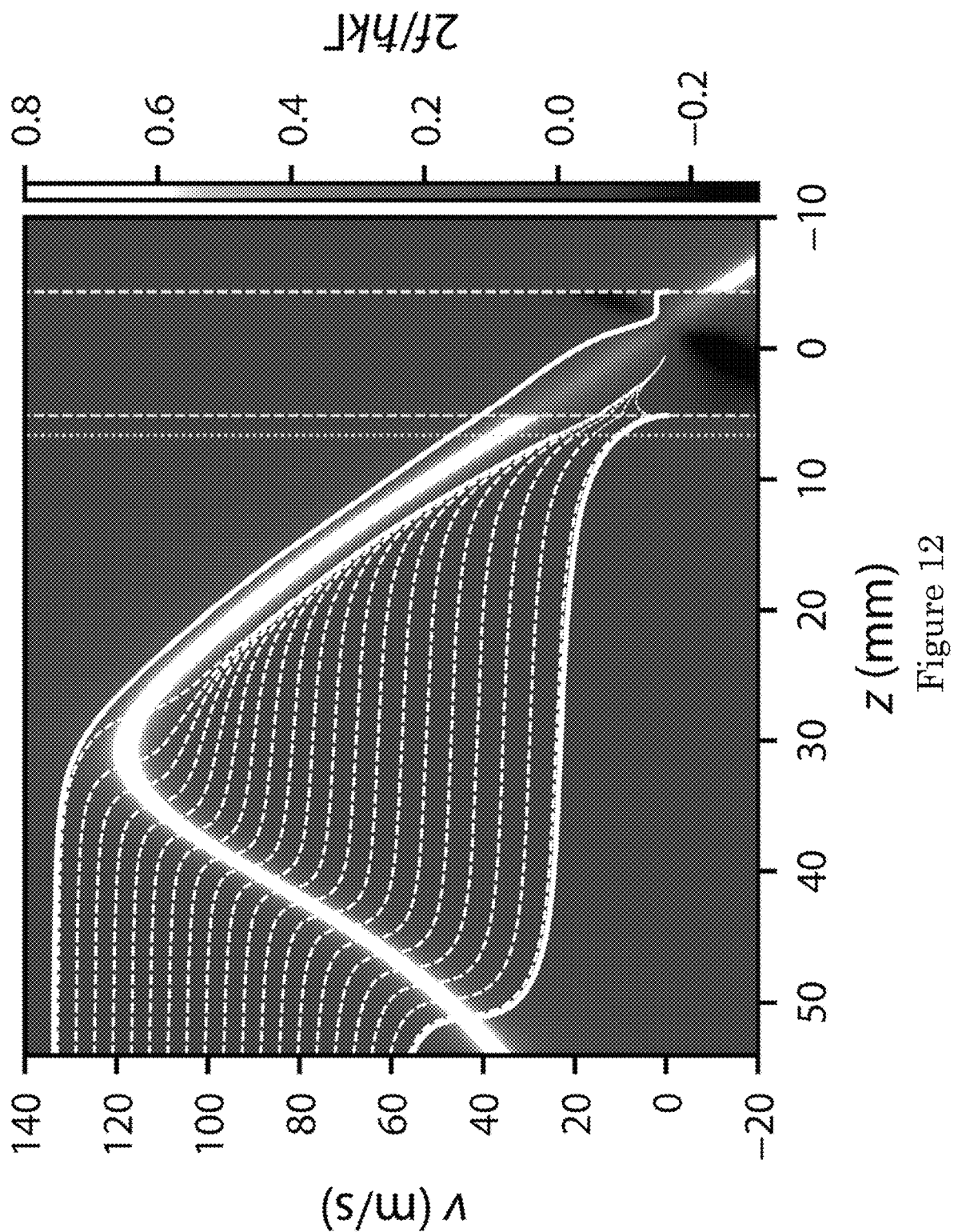
FIG. 12 shows a graph of velocity versus position.

The calculated force along the $\hat{z}$ axis is shown in FIG. 12 for a magnetic field gradient of B'=4.5 mT/cm and a maximum magnetic field of $B_{max} \approx 12$ mT. For these values of B' and $B_{max}$, the magnetic field behind the chip closely matches the ideal $B(z) \propto \sqrt{z}$ profile of a Zeeman slower. The input laser beam (see FIG. 9) is resonant with the cycling transition along the bright yellow curve (i.e., $kv = -\Delta + \mu_B B/\hbar$), maximizing the slowing force f [see Eq. (1)]. The force is reduced in the MOT region (the yellow curve darkens to pale green) because the diffracted laser beams increase stotal (see FIG. 14). The dispenser source is located at $z_s \approx 54$ mm, beyond the maximum of the magnetic field at $z_{max} \approx 30$ mm, and about 10 times further from the MOT than the aperture at $z_a = 5$ mm with characteristic radius $r_a = 2$ mm.

FIG. 12 shows forces on atoms in the Zeeman slower, wherein an axial force on a $^7$Li atom versus position z and axial velocity v for B'=4.5 mT/cm and $B_{max}$=12 mT. The vertical dashed lines denote the MOT region; the vertical short-dashed line denotes the chip location. The atom source is positioned at the left edge of the plot (z=$z_s \approx 54$ mm). The solid curves show the trajectories of the slowest and fastest captured velocities. The dashed white curves show the trajectories for intermediate initial velocities.

Behind the aperture (see FIG. 9), atoms are slowed similarly to an ideal Zeeman slower, where the velocity follows $v_B(z) = \mu_B B(z)/\hbar k$. In this case, all initial velocities $v_0 < v_c = \mu_B B_{max}/\hbar k$ should be slowed. FIG. 12 shows simulated on-axis v(z) trajectories. Atoms emitted from the source with $v_0$ receive a slowing impulse as they come into resonance with the slowing laser beam in the region of increasing magnetic field (z≥30 mm in FIG. 12), travel along the Zeeman slower at nearly constant velocity, and then fall onto the $v_B(z)$ curve.

We calculate the resulting loading rate by considering an effusive source with surface area S. Each area element of the source dS emits φ atoms per second per unit area per steradian, according to a cosine distribution. Due to the size of the chip aperture and MOT beams, only atoms emitted at angles θ (relative to the z axis) less than the capture angle $\theta_c$ are captured by the MOT. Integrating over the full source surface S leads to $$R = 8\sqrt{\pi} \oint_S \phi dS \int_0^{\theta_c} \cos\theta d\theta \int_0^{v_c(\theta)} \frac{v_0^3}{v_p^4} e^{-v_0^2/v_p^2} dv_0 \quad (2)$$

Figure 13:
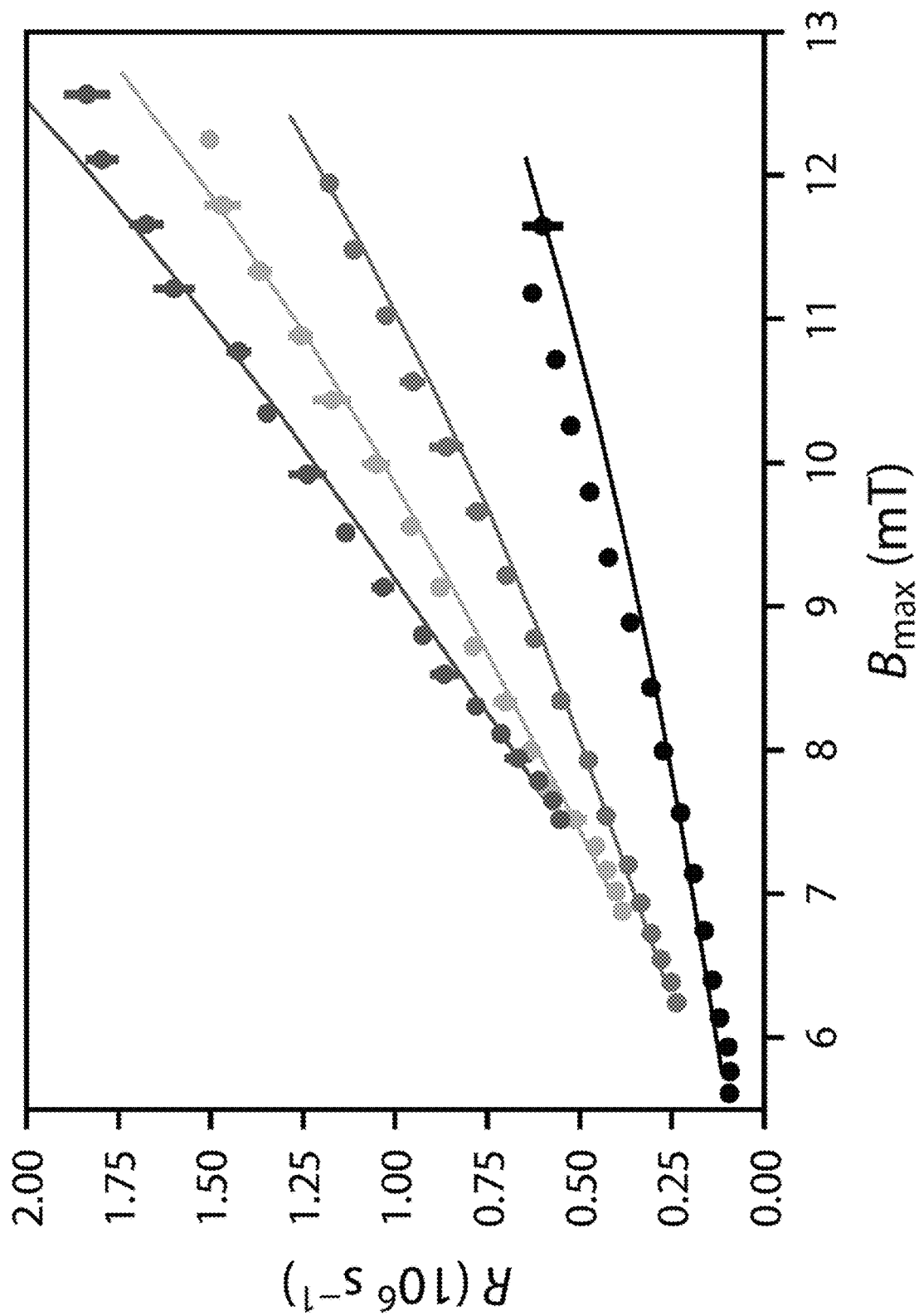
FIG. 13 shows a graph of frequency versus magnetic field strength.

As a first approximation, we consider a point source at x=0, take $v_c$ to be independent of θ, and define the capture angle $\theta_c$ through geometry, i.e., $\tan \theta_c = r + a/(z_s - z_c)$. The capture velocity then scales as $v_c \propto B_{max}$ and thus the loading rate $R \propto B_{max}^4$. FIG. 13 shows the experimental efficacy of our Zeeman slower for four different magnetic field gradients B'. At most, we observe a factor-of-4 increase in R for a doubling of $B_{max}$, suggesting a scaling closer to $B_{max}^2$.

FIG. 13 shows measured loading rate of the MOT with $\Delta/\Gamma_{Li}$=−2.0 and $s_0 = I/I_{sat}$=3.9 at four different magnetic field gradients B': 4 mT/cm, 4.5 mT/cm, 5 mT/cm, and 5.5 mT/cm. The curves are best fits.

The naïve $B_{max}^4$ scaling breaks down if the acceleration required to keep an atom on the $v_B(z)$ curve (see FIG. 12) exceeds the maximum possible acceleration from the slowing laser beam. This condition is expressed as $$\frac{dv_B}{dt} = \frac{dv_B}{dz}\frac{dz}{dt} = \mu_B \hbar k_0 \frac{dv_B(z)}{dz} v_B \frac{\hbar k_0 \Gamma}{m} \frac{s_0}{1+s_0}, \quad (3)$$

where the right-hand side of the inequality is the maximum magnitude of f in the Zeeman slower [see Eq. (1)]. In the present study, the largest $v_B(z_{max}) \approx 120$ m/s, defined by $B_{max} \approx 13$ mT. Combining this largest $v_B(z_{max})$ with $s_0$=3.9 and the largest B'=5.5 mT/cm from FIG. 13, we find that the inequality in Eq. (3) is always fulfilled. Because dB(z)/dz<B' in our apparatus, our calculation also demonstrates that deviations from the ideal $B(z) \propto \sqrt{z}$ field in the Zeeman slower cannot explain the observed scaling of R with $B_{max}$.

Another potential deviation from $R \propto B_{max}^4$ is the assumed independence of $v_c$ and $\theta_c$. Consider the on-axis atomic trajectories in FIG. 14 with a nonzero initial angle with the $\hat{z}$ axis. These trajectories blossom: as the axial velocity decreases, the initial transverse velocity causes the atom to deviate farther off-axis. The blossoming effect reduces $\theta_c$. Neglecting the initial velocity change in the increasing magnetic field region (z≥30 mm in FIG. 12), an atom will travel at its initial velocity v0 until it intersects the universal $v_B(z)$ curve. To illustrate the blossoming effect, we take $v_B(z) \approx v'z$ so that the atom falls onto the universal trajectory at $z_I = v_0/v'$, where $v' = \mu_B B'/\hbar k$. Along the $v_B(z)$ trajectory, the atom obeys $z(t) = (v_0/v')e^{-v't}$. The angle $\theta_c$ that just clears the aperture can then be determined from the source-aperture travel time tsa:

$$\tan\theta_c \approx r_a v_0 t_{sa} = \frac{r_a}{z_s - z_a} \frac{z_s - z_a}{z_s - z_I[1 - \log(z_I/z_a)]}, \quad (4)$$

where we have assumed that $\theta_c \ll 1$. For our device, the term in braces reduces $\theta_c$ by approximately 70% of the geometric limit at B'=5.5 mT/cm and $B_{max}$=13 mT (see FIG. 13). With this correction, the loading rate, evaluated numerically, scales roughly as $R \propto B_{max}^3$ in our region of experimental interest.

Figure 14:
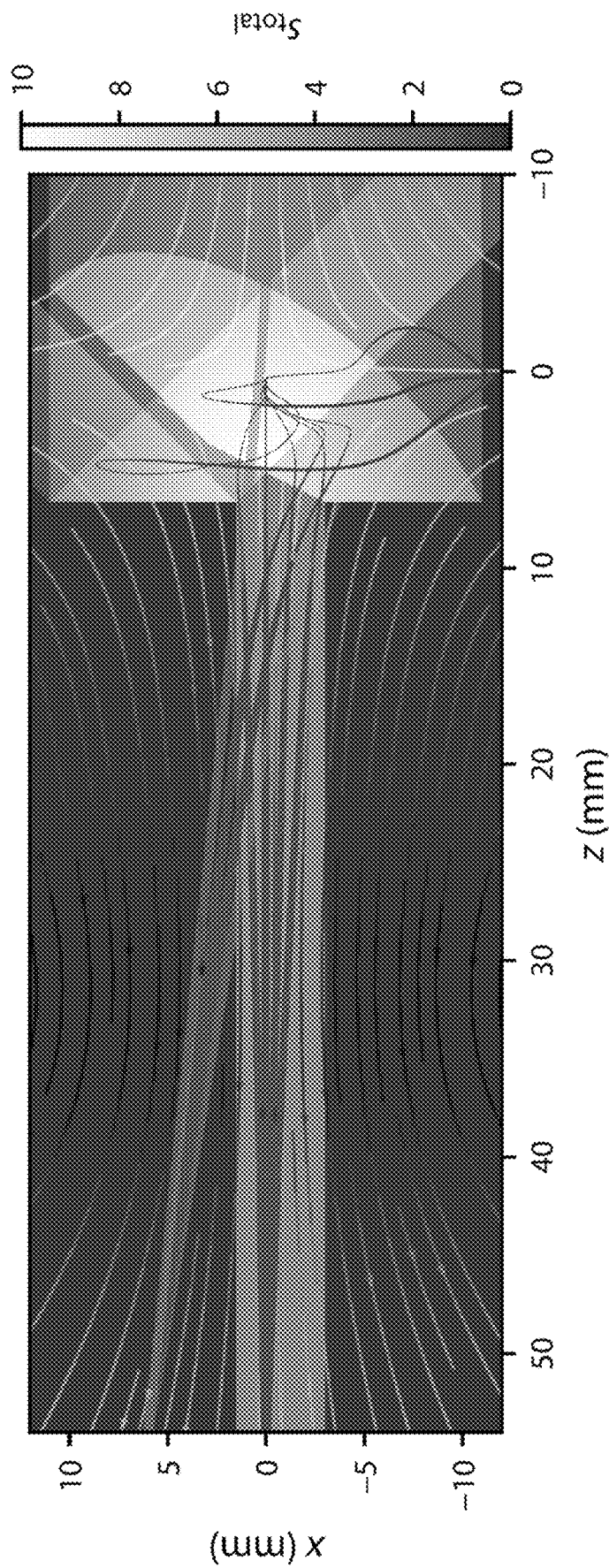
FIG. 14 shows a graph of lateral position versus axial position for trajectories of atoms.

A source that is misaligned with respect to the slowing laser beam was considered. FIG. 14 shows several such trajectories, which start at x≈5 mm with various emission angles. Simulations of these off-axis trajectories indicate that atoms starting outside the slowing laser beam can still be captured provided that they enter the Zeeman slower at a position ze such that $v_B(z_e) > v_0$ and subsequently clear the aperture. We use these two conditions to calculate the scaling of the loading rate for each B', shown in FIG. 13 as the solid curves. The model suggests that the vast majority of the flux is being emitted from the source approximately 2.5 mm outside of the slowing laser beam, a slight misalignment.

FIG. 14 shows off-axis trajectories of atoms, wherein total saturation parameter of all lasers is $s_{total}$; stream lines show magnetic field lines, with a larger magnetic field magnitude being darker. Certain trajectories are trapped trajectories from a source placed behind (to the side of) the chip, starting at $0.7v_c$ ($0.25 v_c$); other trajectories are untrapped. The width of the trajectory curves indicates the magnitude of the velocity.

The device can be modified by moving the source further from the MOT while maintaining alignment with the slowing laser beam. Consider a fixed magnetic field gradient B' throughout all space and a movable source with position $z_s$. The capture velocity for atoms traveling along the $\hat{z}$ axis is $v_c = v' z_s$. As the source moves away from the MOT, the capture velocity increases because $v_c \propto z_s$, but $\theta_c$ decreases as $\tan \theta_c = r_a/(z_s - z_a)$ for small $v_0$ and as $\tan \theta_c \approx r_a v'/[v_0 \log(z_a/z_s)]$ for velocities $v_0 \leq v' z_s$. To understand the competition between vc and θc, we numerically evaluate Eq. (2) as a function of $z_s$. We find that R is roughly constant for $z_s/z_a < 3$ and becomes $R \propto (z_s/z_a)^{3/2}$ for $z_s/z_a > 10$. Therefore, placing the source farther behind the chip is optimal, provided that optical alignment can be maintained, the inequality in Eq. (3) is always satisfied, and the magnetic field gradient can be extended to continue the Zeeman slower.

Loading from behind the chip can outperform loading from the side, given that $v_c$ and $\theta_c$ are roughly equivalent for a source at $z_s = z_a$ and a source placed to the side (see FIG. 9). However, outperforming side loading places additional restrictions on the size of the apparatus ($z_s/z_a > 3$), beam alignments, and source placement. As an example, a source placed to the side might have performed equally well in the device presented here. We simulated several side-loaded trajectories, shown in green in FIG. 14, and found that the side-loaded capture velocity is roughly 25% that of the best on-axis capture velocity. The reduction in capture velocity is compensated by the increase in $\theta_c$, causing R to be unchanged. Moving our source forward to the position of the peak magnetic field (i.e., $z_s = z_{max}$) would be sufficient for back loading to be faster than side loading.

The single-beam slowing and trapping apparatus for $^7$Li atoms traps more than $10^6$ atoms with loading rates exceeding $10^6$ s$^{-1}$. The integrated Zeeman slower behind the chip is effective in increasing the captured flux by over a factor of 3. The source placement prevents unwanted metal deposition on the grating and allows for future vacuum improvements via differential pumping.

The design can easily be adapted to serve as a cold gas source for a variety of applications. By implementing differential pumping or using a low-outgassing atom source (rather than a dispenser), the device can be used as a primary vacuum gauge. The diffraction grating period and etch depth can be altered to optimize trapping of other elements, such as Rb, Cs, Ca, Sr, or Yb. The trapping of alkaline-earth atoms using our apparatus would allow the development of portable optical frequency standards, which could be used for geodesy or space-based gravitational wave detection and can be used for redefinition of the SI second. A multiple-length Z-wire magnetic trap could be patterned onto the back of our grating chip, permitting atoms to be pulled closer to the chip surface for chip-scale atom interferometers or quantum memories. The tetrahedral MOT configuration can provide "type-II" MOTs, which are used to laser cool and trap molecules. The device can trap molecules from a buffer-gas beam source for a deployable device using laser-cooled molecules.

The dispenser can mode match the slowing laser beam and be placed close to the maximum of the magnetic field. The Zeeman slower can be shortened by increasing the magnetic field gradient. Differential pumping decreases loss rate τ and increases an equilibrium number of atoms in the MOT.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A uniaxial counter-propagating monolaser atom trap for cooling and trapping atoms with a single a laser beam, the uniaxial counter-propagating monolaser atom trap comprising:
an atom source that provides primary atoms, such that the primary atoms move in an atom primary direction;
a light source opposing the atom source and that produces primary light, the primary light propagating in a light primary direction, the light primary direction opposing the atom primary direction such that the primary light counter-propagates relative to the primary atoms;
an atom slower interposed between the atom source and the light source and that:
receives the primary atoms from the atom source;
receives the primary light as slowing light;
subjects the primary atoms to the slowing light; and
slows the primary atoms to form slowed atoms from the primary atoms in response to interaction of the primary atoms with the slowing light, the slowed atoms moving in the atom primary direction;
an optical diffractor interposed between the atom slower and the light source and comprising:
a diffraction surface opposing the light source;
a slower surface opposing the atom source;
an atom transfer wall that bounds an atom transfer aperture;
the atom transfer aperture that communicates the slowed atoms to a trapping region from the atom slower and communicates the primary light to the atom slower from the trapping region;
a plurality of diffraction gratings disposed on the diffraction surface and comprising:
a first diffraction grating that receives the primary light from the light source and produces first reflected light from the primary light, the first reflected light moving in a first light reflection direction;
a second diffraction grating that receives the primary light from the light source and produces second reflected light from the primary light, the second reflected light moving in a second light reflection direction; and
a third diffraction grating that receives the primary light from the light source and produces third reflected light from the primary light, the third reflected light moving in a third light reflection direction;
the trapping region interposed between the optical diffractor and the light source and that:
receives the first reflected light, the second reflected light, and the third reflected light such that the first reflected light, the second reflected light, and the third reflected light intersect in a reflected light intersection volume in the trapping region to form trap light from the first reflected light, the second reflected light, and the third reflected light;
receives the slowed atoms in the trap light; and
produces trapped atoms from the slowed atoms in response to subjecting the slowed atoms to the trap light.

2. The uniaxial counter-propagating monolaser atom trap of claim 1, further comprising:
a flow tube disposed on the slower surface and opposing the atom source and that receives the slowed atoms from the atom slower and communicates the slowed atoms from the atom slower to the trapping region through the atom transfer aperture.

3. The uniaxial counter-propagating monolaser atom trap of claim wherein the trapping region further comprises a magneto-optical trap.

4. The uniaxial counter-propagating monolaser atom trap of claim 1, wherein the atom slower comprises a Zeeman slower.

5. The uniaxial counter-propagating monolaser atom trap of claim 1, wherein the atom slower comprises a slower member interposed between the atom source and the optical diffractor.

6. The uniaxial counter-propagating monolaser atom trap of claim 5, wherein the slower member comprises magnetic field coils, a permanent magnet, a voltage electrode, or a combination comprising at least one of the foregoing slower members.

7. The uniaxial counter-propagating monolaser atom trap of claim 6, wherein the slower member is the magnetic field cons that produces a spherical magnetic quadrupole field.

8. The uniaxial counter-propagating monolaser atom trap of claim 1, wherein the first diffraction grating comprises a first set of linear grating lines; the second diffraction grating comprises a second set of linear grating lines; and the third diffraction grating comprises a third set of linear grating lines.

9. The uniaxial counter-propagating monolaser atom trap of claim 8, wherein the first set of linear grating lines, the second set of linear grating lines, and the third set of linear grating lines are arranged on the diffraction surface in three truncated triangles, wherein the atom transfer aperture is centrally disposed among the three truncated triangles.

10. The uniaxial counter-propagating monolayer atom trap of claim 1, further comprising a shutter interposed between the atom source and the atom slower and that interrupts communication of the primary atoms from the atom source to the atom slower.

11. The uniaxial counter-propagating monolayer atom trap of claim 1, further comprising a vacuum chamber in which are disposed the atom slower, the optical diffractor, and the trapping region.

12. The uniaxial counter-propagating monolaser atom trap of claim 1, further comprising:
a first permanent magnet interposed between the optical diffractor and the light source and that provides an axial magnetic field directed along the light primary direction; and
a second permanent magnet interposed between the optical diffractor and the light source and that provides a two-dimensional magnetic field gradient along the light primary direction.

13. The uniaxial counter-propagating monolaser atom trap of claim 12, wherein the optical diffractor further comprises a fourth diffraction grating that receives the primary light from the light source and produces fourth reflected light from the primary light, the fourth reflected light moving in a fourth light reflection direction.

14. The uniaxial counter-propagating monolaser atom trap of claim 1, wherein the light source produces a first primary light and a second primary light that are combined in primary light,
wherein the second primary light comprises a frequency that is chirped for slowing the primary atoms.

15. An optical diffractor for cooling and trapping atoms with a single a laser beam, the optical diffractor comprising:
a diffraction surface;

a slower surface on a side of the optical diffractor opposite the diffraction surface;

an atom transfer wall that bounds an atom transfer aperture;

the atom transfer aperture that communicates slowed atoms to a trapping region from an atom slower and communicates primary light to the atom slower from the trapping region;

a plurality of diffraction gratings disposed on the diffraction surface and comprising:

a first diffraction grating that receives the primary light from a light source and produces first reflected light from the primary light, the first reflected light moving in a first light reflection direction;

a second diffraction grating that receives the primary light from the light source and produces second reflected light from the primary light, the second reflected light moving in a second light reflection direction; and a third diffraction grating that receives the primary light from the light source and produces third reflected light from the primary light, the third reflected light moving in a third light reflection direction, wherein the diffraction gratings reflects the primary light as the first reflected light, the second reflected light, and the third reflected light respectively along the first light reflection direction, the second light reflection direction, and the third light reflection direction into the trapping region so that the first reflected light, the second reflected light, and the third reflected light intersect in a reflected light intersection volume in the trapping region and form trap light that traps the slowed atoms to form trapped atoms from the slowed atoms.

16. The uniaxial counter-propagating monolaser atom trap of claim 15, wherein the first diffraction grating comprises a first set of linear grating lines; the second diffraction grating comprises a second set of linear grating lines; and the third diffraction grating comprises a third set of linear grating lines.

17. The uniaxial counter-propagating monolaser atom trap of claim 16, wherein the first set of linear grating lines, the second set of linear grating lines, and the third set of linear grating lines are arranged on the diffraction surface in three truncated triangles, wherein the atom transfer aperture is centrally disposed among the three truncated triangles.

18. A process for cooling and trapping atoms with the uniaxial counter-propagating monolaser atom trap of claim 1, the process comprising:

providing primary atoms from the atom source, such that the primary atoms move in the atom primary direction;

producing, by the light source, primary light, the primary light propagating in the light primary direction, the light primary direction opposing the atom primary direction;

counter-propagating the primary light relative to the primary atoms;

receiving, by the atom slower, the primary atoms from the atom source;

communicating the primary light to the atom slower from the trapping region;

receiving, by the atom slower, the primary light as slowing light;

subjecting the primary atoms to the slowing light;

slowing the primary atoms by the slowing light;

forming the slowed atoms from the primary atoms in response to interaction of the primary atoms with the slowing light, the slowed atoms moving in the atom primary direction;

communicating, by the atom transfer aperture, the slowed atoms to the trapping region from the atom slower receiving, by the first diffraction grating, the primary light from the light source;

producing, by the first diffraction grating, the first reflected light from the primary light, the first reflected light moving in a first light reflection direction;

receiving, by the second diffraction grating, the primary light from the light source;

producing, by the second diffraction grating, the second reflected light from the primary light, the second reflected light moving in a second light reflection direction;

receiving, by the third diffraction grating, the primary light from the light source;

producing, by the third diffraction grating, the third reflected light from the primary light, the third reflected light moving in a third light reflection direction;

receiving, by the trapping region, the first reflected light, the second reflected light, and the third reflected light;

intersecting the first reflected light, the second reflected light, and the third reflected light in a reflected light intersection volume in the trapping region;

forming trap light from the first reflected light, the second reflected light, and the third reflected light;

receiving the slowed atoms in the trap light; and subjecting the slowed atoms to the trap light to produce trapped atoms from the slowed atoms.

* * * * *